US010547158B1

(12) United States Patent
McColloch et al.

(10) Patent No.: US 10,547,158 B1
(45) Date of Patent: Jan. 28, 2020

(54) OPTICAL COMMUNICATION DEVICE AND SYSTEM

(71) Applicant: Avago Technologies International Sales Pte. Limited, Singapore (SG)

(72) Inventors: Laurence McColloch, Santa Clara, CA (US); David W. Dolfi, Los Altos, CA (US); Venkatesh Seetharam, Fremont, CA (US); Alexander Robertson, Chalfont, PA (US); Georgios Asmanis, Lake Forest, CA (US); Michael Allen Robinson, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/176,171

(22) Filed: Oct. 31, 2018

(51) Int. Cl.
*G02B 6/42* (2006.01)
*H01S 5/022* (2006.01)
*H01S 5/026* (2006.01)

(52) U.S. Cl.
CPC ............ *H01S 5/0265* (2013.01); *G02B 6/428* (2013.01); *G02B 6/4245* (2013.01); *G02B 6/4257* (2013.01); *G02B 6/4274* (2013.01); *H01S 5/0268* (2013.01); *H01S 5/02276* (2013.01)

(58) Field of Classification Search
None
See application file for complete search history.

(56) References Cited

U.S. PATENT DOCUMENTS

| | | | |
|---|---|---|---|
| 5,602,672 A * | 2/1997 | Ishimura | G02F 1/0121 359/245 |
| 8,723,102 B2 | 5/2014 | Unterborsch et al. | |
| 2005/0213882 A1* | 9/2005 | Go | G02B 6/4201 385/37 |
| 2007/0248363 A1* | 10/2007 | Kagaya | H01S 5/02248 398/200 |
| 2010/0246629 A1* | 9/2010 | Fujii | H01S 5/4068 372/50.121 |
| 2010/0254665 A1* | 10/2010 | Kubota | G02B 6/4204 385/88 |
| 2016/0370609 A1* | 12/2016 | Nakamura | G02F 1/025 |
| 2017/0310078 A1* | 10/2017 | Hirayama | H01S 5/0265 |
| 2018/0076595 A1* | 3/2018 | Honda | H01S 5/02446 |

\* cited by examiner

*Primary Examiner* — Michael Stahl
(74) *Attorney, Agent, or Firm* — Sheridan Ross P.C.

(57) ABSTRACT

An optical communication system, device, and method are disclosed. An illustrative optical communication system is disclosed to include a carrier Integrated Circuit (IC) chip having an amplifier circuit, a bias plane, and a ground plane. The amplifier circuit, bias plane, and the ground plane may each operate at or above a nominal voltage of zero volts. A laser diode may be integrated with an electro-absorption modulator into a single IC chip, where the laser diode is mounted on the carrier IC chip and is electrically connected with the amplifier circuit of the carrier IC chip through a bond wire.

20 Claims, 19 Drawing Sheets

US 10,547,158 B1

OPTICAL COMMUNICATION DEVICE AND SYSTEM

FIELD OF THE DISCLOSURE

The present disclosure is generally directed toward communication systems and, more specifically, toward optical communication systems.

BACKGROUND

Conventional designs for high-speed optical transceivers, such as a 400G transceiver, often try to place the physical layer Integrated Circuit (IC) chip as close to the connector as possible in an effort to minimize electrical losses. There is often a Transmitter Optical Sub-Assembly (TOSA) that includes the optical receptacle which must be placed at the front of the transceiver. In many designs, the TOSA has to be rigidly mounted at the front of the transceiver and, to avoid being mechanically over constrained, is connected to the Printed Circuit Board (PCB) by a flex circuit. The flex circuit may be hot bar soldered to the PCB. The PCB pad size required to make a hot bar connection is many times bigger than the signal trace and is a major impedance disruption. There is often excess solder which adds to the impedance discontinuity.

The laser, which may be an Electro-absorption Modulated Laser (EML) in some solutions, is mounted on ground and requires the amplifiers to be connected thru a bias tee. Bias tees are sometimes required because the substrate to the modulator requires a negative bias voltage. The logic conventionally used for drivers, CMOS and SiGe, have difficulty working with negative voltages and the common solution of a bias tee allows an amplifier working at positive voltages, to be AC coupled to the modulator while the modulator is being biased at a negative voltage. The bias tee is physically large compared to the trace, thereby disrupting the impedance and moving the amplifier farther away. The impedance disruptions of the bias tee, hot bar soldered flex as well as other geometry issues almost entirely close a PAM4 eye diagram regardless of the quality of the EML or amplifier. Not only are the bias tees introducing performance problems to the transceiver, but they are a costly component in the overall bill of materials for the transceiver.

BRIEF DESCRIPTION OF THE DRAWINGS

The present disclosure is described in conjunction with the appended figures, which are not necessarily drawn to scale.

DETAILED DESCRIPTION

Figure 1:
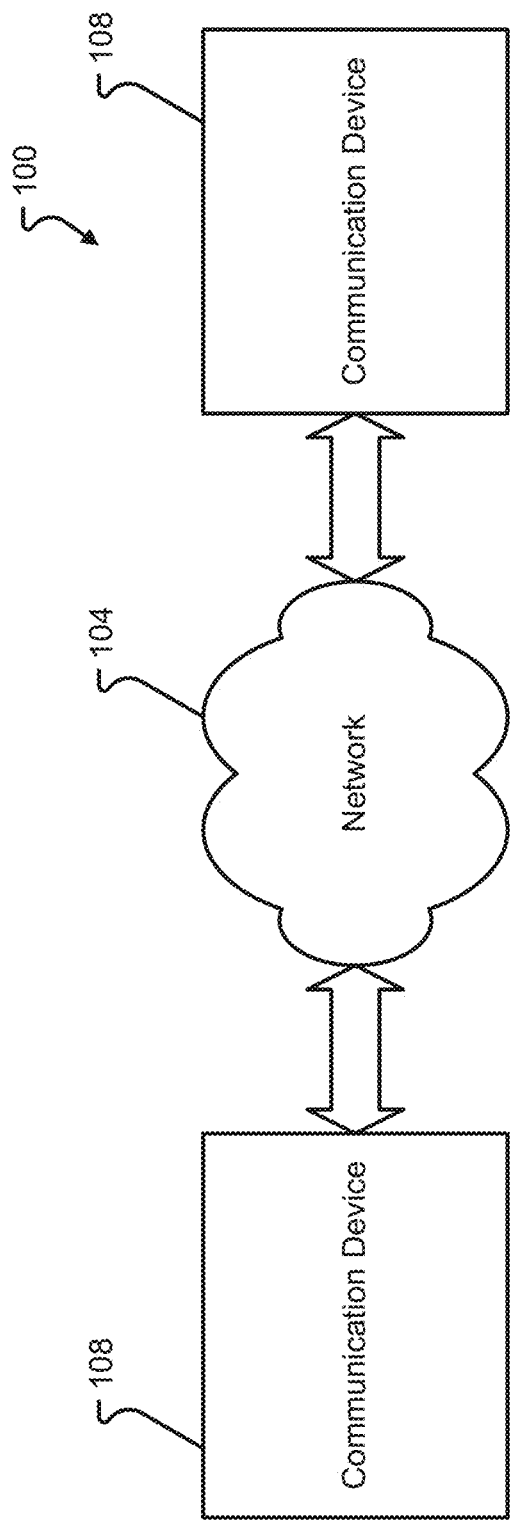
FIG. 1 is a block diagram depicting a data transmission system in accordance with at least some embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, it should be appreciated that the various links connecting the elements can be wired, traces, or wireless links, or any combination thereof, or any other known or later developed element(s) that is capable of supplying and/or communicating data to and from the connected elements. Transmission media used as links, for example, can be any suitable carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," and "compute," and variations thereof, as used herein, are used interchangeably and include any type of methodology, process, mathematical operation or technique.

Various aspects of the present disclosure will be described herein with reference to drawings that are schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-25, various optical communication systems, optical communication devices, and methods of controlling such systems and devices will be described in accordance with at least some embodiments of the present disclosure.

With reference now to FIG. 1, details of a data transmission system 100 will be described in accordance with at least some embodiments of the present disclosure. The data transmission system 100 is shown to include two communication devices 108, each of which are connected with a communication network 104. The communication devices 108 may be considered to be communicatively coupled with one another via the communication network 104. Although the communication devices 108 may be provided as any type of machine or collection of components, some non-limiting examples of a communication device 108 include a mobile phone, a smart phone, a Personal Computer (PC), a laptop, a telephone, a tablet, a server, a switch, or data storage device, etc. It should be appreciated that one or both communication devices 108 may be user devices (e.g., devices that are carried and utilized by a user) having a user interface. Alternatively, one or both communication devices 108 may be servers, switches, or other types of machines that are devoid of a robust user interface. Said another way, the communication devices 108 may correspond to any type of machine capable of communicating with another machine via the communication network 104.

The communication network 104 may correspond to any type of communication bus, collection of communication devices, combinations thereof, or the like. As an example, the communication network 104 may correspond to a packet-based communication network. Even more specifically, the communication network 104 may correspond to an IP-based communication network and may use communication protocols such as the Ethernet protocol. It should be appreciated that the communication network 104 does not necessarily need to be limited to an Ethernet-based communication network, but rather any interconnected collection of computing devices using any type of communication protocol or combination of communication protocols may qualify as the communication network 104. The communication network 104 may utilize wired and/or wireless communication protocols.

In some embodiments, the data transmission system 100 may correspond to a memory system in which one of the communication devices 108 is a host device connected with another communication device 108 which may be configured as a memory controller or the like. In particular, the host device may be configured to send I/O commands to the memory controller via a communication network 104 and the memory controller may respond to such I/O commands in turn. Although not depicted in FIG. 1, the memory controller may be further connected to a memory system that includes one or multiple computer memory devices that are connected via a storage backend. As will be discussed in further detail herein, the communication devices 108 may include one or more transmitter components, receiver components, and/or transceiver components that enable communications over the communication network 104.

Figure 2:
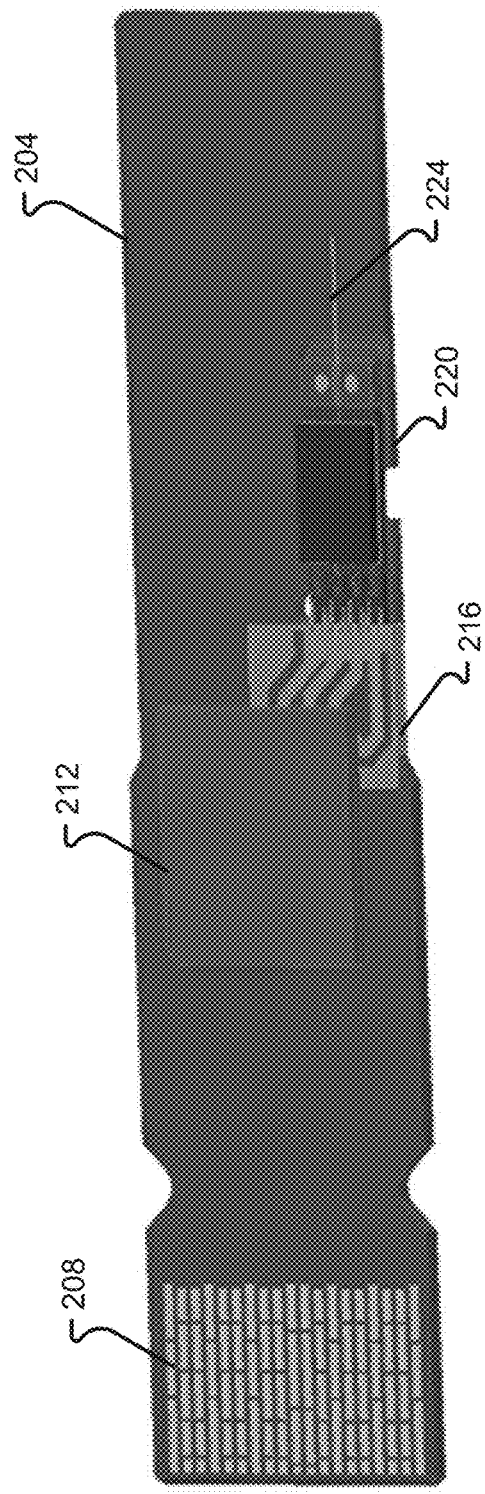
FIG. 2 is an isometric view of a transceiver paddle card PCB in accordance with at least some embodiments of the present disclosure.

With reference now to FIG. 2, additional details of a transceiver card 204 that may be included in a communication device 108 will be described in accordance with at least some embodiments of the present disclosure. The transceiver card 204 is shown to include a plurality of contacts 208 provided on a first surface of a card substrate. The contacts 208 may be used to electrically connect the transceiver card 204 and components mounted thereon to other components of a communication device 108, for example.

The transceiver card 204 is also shown to include a physical layer IC 212, a TMUX 220 (Transmit Multiplexer), and a fiber optic 224. In some embodiments, the card 204 may correspond to a Quad Small Form-factor Pluggable (QSFP)-DD paddle card, which is a compact, hot-pluggable transceiver used for data communications applications. The QSFP-DD paddle card 204 may be attachable to a server, PC, memory device, or the like.

The physical layer IC 212 may be mounted on a first surface of the transceiver card 204 and, in some embodiments, may be mounted on the same side as the contacts 208. The transceiver card 204 may include a section 216 with one or more conductive traces that carry signals from the physical layer IC 212 to the TMUX 220.

The section 216 of the transceiver card 204 may provide electrical connectivity between the physical layer IC 212 and the TMUX 220. In some embodiments, a portion of the TMUX 220 may be provided in a common plane as the transceiver card 204 whereas other portions of the TMUX 220 may be provided above the plane of the transceiver card 204. In some embodiments, the TMUX 220 provides a mechanism for converting electrical signals received from the physical layer IC 212 via the section 216 into an optical signal (or collection of optical signals) that are transmittable across the fiber optic 224. In some embodiments, the fiber optic 224 corresponds to a single piece of optical fiber that is positioned to receive and carry an optical signal generated within the TMUX 220 (or components thereof).

Figure 3:
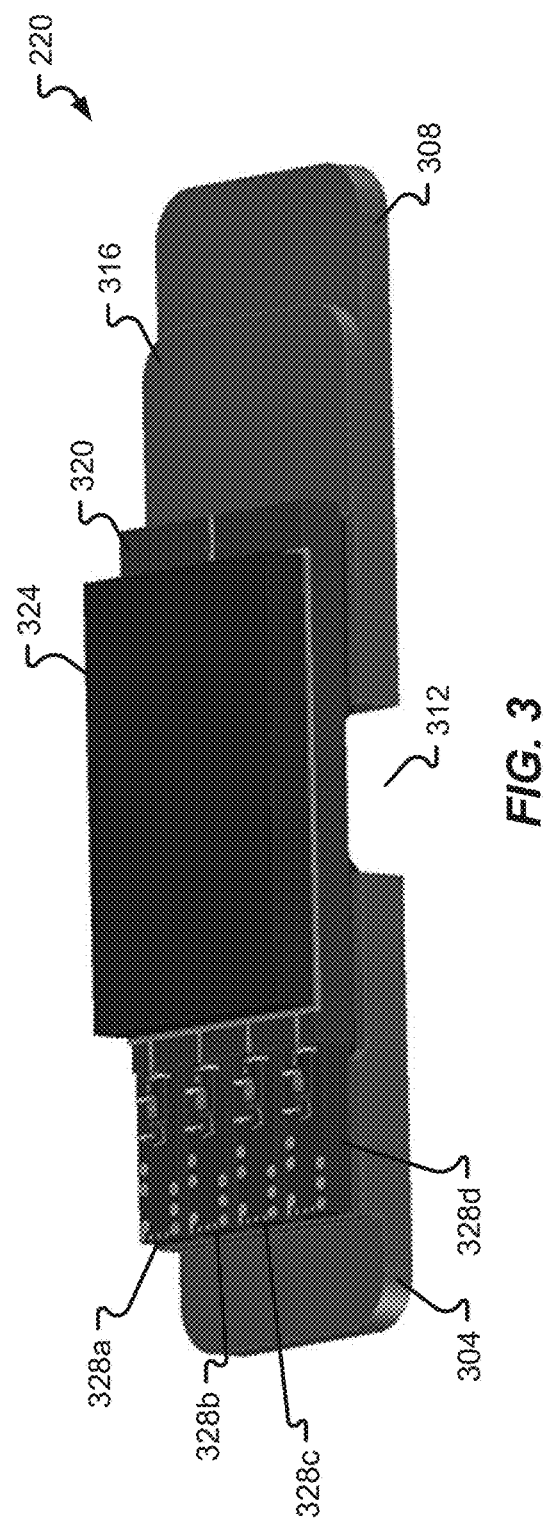
FIG. 3 is an isometric view of a transmitter multiplexer (TMUX) in accordance with at least some embodiments of the present disclosure.

With reference now to FIGS. 3-8, additional details of the TMUX 220 and components thereof will be described in accordance with at least some embodiments of the present disclosure. FIG. 3 illustrates the TMUX 220 as including a lead frame having a first end 304, a second end 308, and a bridge 312 provided between the first end 304 and second end 308. In some embodiments, material of the TMUX 220 lead frame may physical support a plurality of COICs 328a, 328b, 328c, 328d, a (Planar Light Circuit) PLC 320, and a PLC reinforcement 324. As shown in FIG. 3, the plurality of COICs 328a-d may be provided on the first end 304 of the lead frame and may be mounted atop a raised portion 316 of the lead frame. Each of the COICs 328a-d, in some embodiments, may be positioned adjacent to one another and may be configured to generate optical signals in response to received electrical signals.

In some embodiments, the lead frame may be constructed of any type of material that can sufficiently conduct heat away from the COICs 328a-d. As a non-limiting example, the lead frame material may correspond to copper, whose conductivity is between 260-400 w/m·k, and is capable of providing a high-level thermal performance for the TMUX 220. Because positioning of optical components may be highly sensitive to position changes, it may be desirable to minimize the amount of movement that occurs between the various optical components supported by the lead frame. Thus, the matching of coefficients of thermal expansion (CTE) between various supporting materials may be desirable. In some embodiments, copper or some other highly-conductive metal may be used to provide desired conductivity, form-ability, low cost and well-known manufacturing. Unfortunately, the use of copper, as an example, may provide a high mis-match of CTE between other optical components that are not made of copper. In some embodiments, the lead frame may be designed to account for such CTE mis-matching by cutting out the middle section (e.g., by creating the bridge 312 between the first end 304 and second end 308). In some embodiments, the bridge 312 shortens the length of the mis-matched CTE to minimize movement between optical components mounted on the lead frame. As will be discussed in further detail herein, thin epoxy joints may be used to connect the various optical components of the TMUX 220. Such thin joints may be used to fix the lead frame at chosen points to the PLC 320. In some embodiments, the size of the bridge 312 may be less than half the length of the PLC 320, but larger than one fourth the length of the PLC 320. Such a size of the bridge 312 may help to ensure that a proper physical support is provided to the PLC 320 while also providing a sufficient mechanism for addressing CTE mis-matches between the lead frame material and materials of the optical components (e.g., COICs 328a-d, PLC 320, etc.).

It should be appreciated that while the TMUX 220 is depicted as having four COICs 328a-d, the TMUX 220 may include a greater or lesser number of COICs without departing from the scope of the present disclosure. For instance, the TMUX 220 may include one, two, three, four, five, . . . , ten, or more COICs 328 without departing from the scope of the present disclosure.

Figure 4:
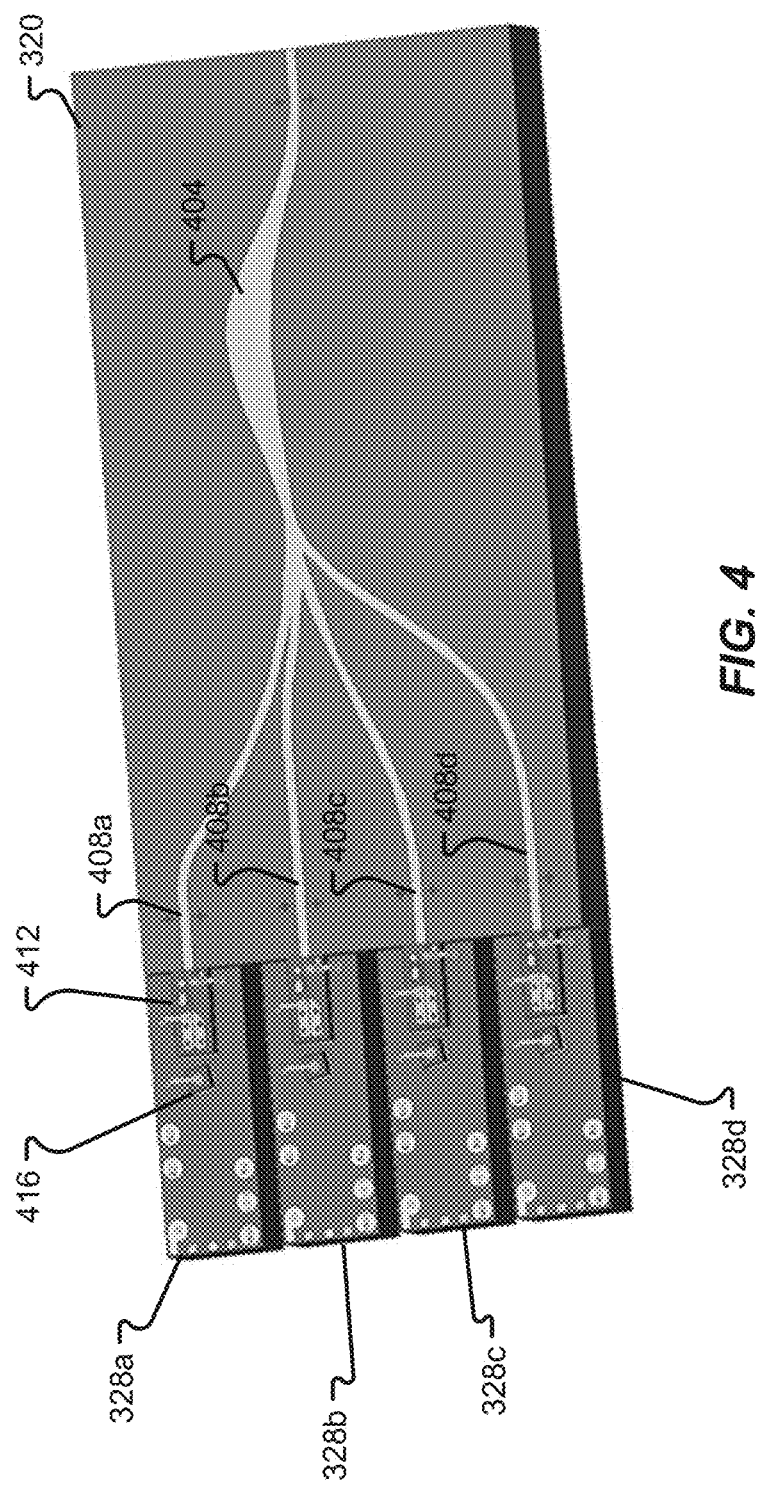
FIG. 4 is an isometric view of a planar light circuit (PLC) in accordance with at least some embodiments of the present disclosure.

As can be seen in FIG. 4, the PLC 320 may be abutted to the plurality of COICs 328a-d. Specifically, a first side end of the PLC 320 may abut each of the COICs 328a-d. In some embodiments, the PLC 320 may include a plurality of optical channels 408a-d, where the number of COICs 328a-d equals the number of optical channels 408a-d on the PLC 320. In some embodiments, the discrete optical channels 408a-d may feed into a combined optical channel 404, which is eventually fed to the fiber optic 224.

In some embodiments, the COICs 328a-d may be actively aligned with their corresponding optical channel 408a-d. Specifically, the first COIC 328a may be actively aligned with the first optical channel 408a, the second COIC 328b may be actively aligned with the second optical channel 408b, the third COIC 328c may be actively aligned with the third optical channel 408c, and the fourth COIC 328d may be actively aligned with the fourth optical channel 408d. In some embodiments, once the COICs 328a-d are properly aligned with their corresponding optical channel 408a-d, the COICs 328a-d may each be glued in place onto the lead frame of the TMUX 220 such that the position of the COICs 328a-d become fixed relative to the PLC 320.

In some embodiments, the PLC 320 may correspond to a planar array array waveguide grating (AWG). As a non-limiting example, the PLC 320 and the channels 404, 408a-d implemented therein may be implemented in silicon. In some embodiments, each optical channel 408a-d may be used to carry different colors of light (generated by the different COICs 328a-d) and the discrete optical channels 408a-d may combine the different colors of light into a single optical signal that is carried on the combined optical channel 404 and provided to the fiber optic 224.

Figure 5:
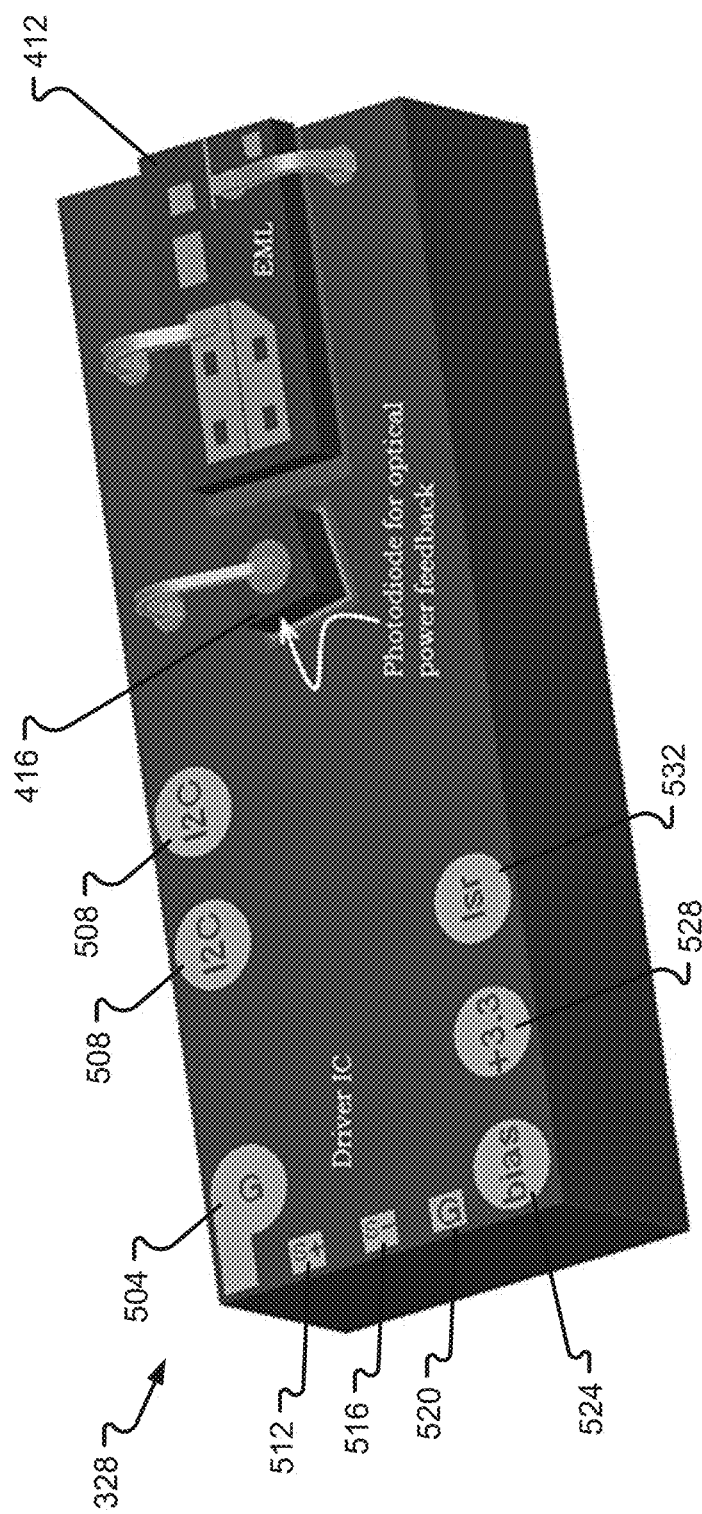
FIG. 5 is an isometric view of a Chip on IC (COIC) in accordance with at least some embodiments of the present disclosure.

FIG. 5 depicts additional details of a COIC 328 in accordance with at least some embodiments of the present disclosure. The COIC 328 may correspond to any of the COICs 328a-d provided in the TMUX 220 without departing from the scope of the present disclosure. The illustrative COIC 328 is shown to include an EML 412 provided on its top surface along with a photodiode 416 mounted proximate thereto. In some embodiments, a side surface of the EML 412 is positioned flush with an end surface of the COIC 328. This particular configuration of the EML 412 relative to the end surface of the COIC 328 may enable the EML 412 to be precisely aligned with a corresponding optical channel 408 in the PLC 320.

The EML 412 may correspond to any type of light-emitting device that is capable of converting an electrical signal into an optical signal. The non-limiting example of the light-emitting device being an electro-absorption modulated laser should not be construed as limiting embodiments described herein. Rather, it should be appreciated that the EML 412 may be implemented as a directly modulated laser (DML) source or any other type of light-emitting device known in the art.

An EML 412 may correspond to a laser diode integrated with an electro-absorption modulator (EAM) in a single chip. The laser diode section, normally with the same device structure as DML, operates under a continuous wave (CW) condition, and input voltage on/off signals are applied to the EAM section to generate optical output signals. Therefore, the laser properties themselves are not changed by the process of modulation, as they would be in a DML. EMLs 412 may be advantageous in applications with higher speeds and longer distance transmission, compared to a DML, because of its tighter wavelength control/smaller chirp.

In some embodiments, the photodiode 416 is provided as a mechanism for measuring an optical power used by the EML 412. More specifically, the photodiode 416 may be configured as a photodiode that provides optical power feedback for a control circuit contained within the driver IC of the COIC 328. In some embodiments, the various circuit components and driver elements of the COIC 328 may be provided in silicon and within the package of the COIC 328. The various circuit components and driver elements of the COIC 328 may be connectable to external circuit components via one or more inputs or outputs exposed at the outer surface of the COIC 328. Non-limiting examples of such inputs and output include a first ground contact 504, one or more I2C contacts 508, a positive signal contact 512, a negative signal contact 516, a second ground contact 520, a bias contact 524, a power supply contact 528, and a laser contact 532.

In some embodiments, one, some, or all of the contacts may be connected with the internal components of the COIC 328 via one or more conductive vias that extend within various layers of silicon (which are packaged within the COIC 328). In some embodiments, the first ground contact 504 may correspond to a ground contact for the COIC 328. The I2C contacts 508 may correspond to various I2C inputs or outputs that enable connectivity between an external I2C bus and I2C components of the COIC 328.

The positive signal contact 512 and negative signal contact 516 may correspond to contacts that are used to pass electrical data at the required data rate from the physical layer IC 212. In some embodiments, the inputs received at the signal contacts 512, 516 may be used to drive or control operation of the EML 412. The second ground contact 520 may complete the Ground-Signal-Signal-Ground (GSSG) configuration that is desirable for good signal performance.

The bias contact 524 may be configured to provide a constant bias voltage, based on the input applied thereto, across the various components in the COIC 328. In some embodiments, the bias voltage received at the bias contact 524 may also be applied to the EML 412 to control operation thereof as well.

In some embodiments, the COIC 328 operates, at least in part, as the driver amplifier for the EML 412. The COIC 328 may provide the advantage of delivering to the EML modulator a signal with higher voltage amplitude and less distortion as compared to previous transmitter designs. This advantage may translate to less light required to transmit a useable signal, thereby creating a power savings in the total transmitter system. Unfortunately, the COIC 328 may raise the temperature of the EML 412, which is temperature sensitive, because the EML sits atop 328 a power dissipating IC. This means that the thermal performance of the lead frame for the TMUX 220 will be more useful as compared to previous designs. As discussed above, the TMUX 220 may provide a 6 degree C./watt package due to its unique design and use of highly-conductive materials.

The EML sits atop the COIC which can hold the base of the EML at any voltage, while conventional designs hold the base of the EML at ground voltage. This means that the COIC can hold the base of the EML at perhaps a positive voltage. The advantage of a positive voltage is that the EML's modulator could then work at a positive voltage. The EML's base voltage can be driven with a positive voltage that allows the modulator to always work within the voltage range available in the driver IC, in a DC connection. This voltage does not need to be constant and indeed can be varied so that all of the voltage swing of the IC is available to modulate the signal. Current designs have to reduce the voltage available for the modulator by amounts associated with biasing the EML. thereby allowing the COIC 328 to entirely contain simple and intuitive logic components. In other words, the bias range is not limited for the COIC 328 according to embodiments of the present disclosure. The COIC 328 may be designed to allow for more modulation voltage because the entire range of the amplifier is available for modulation (e.g., no significant losses for bias). Up to a point, more modulation voltage allows the light emitting device (e.g., laser) to be operated with lower current.

Conventional systems have long lengths between components (as judged by a 28 Ghz signal). The traditional system is terminated at 50 ohms. It should be noted that the modulator in accordance with embodiments of the present disclosure exhibits a 33 ff capacitance at 28 GHz. With a typical photo-resistance, the reactance may be on the order of 140 ohms, consequently, much more power is going to the 50 ohm termination and only a small portion of the energy is going to the modulator.

Figure 6A:
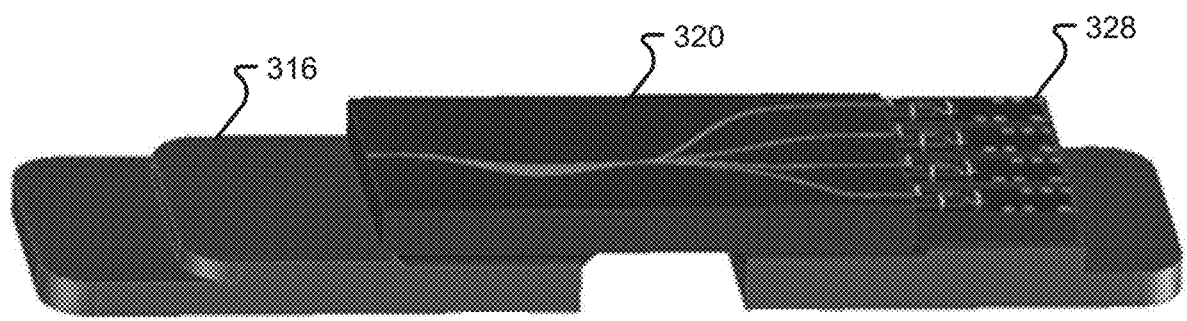
FIG. 6A is another isometric view of a TMUX in accordance with at least some embodiments of the present disclosure.
Figure 6B:
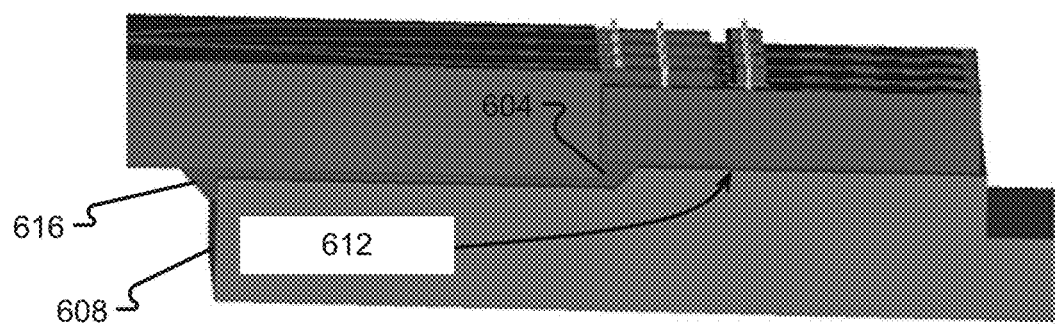
FIG. 6B is a side view of a TMUX in accordance with at least some embodiments of the present disclosure.

As can be seen in FIGS. 6A, 6B, 7, and 8, the construction of the TMUX 220 and the lead frame may be particularly configured to dissipate heat away from the COICs 328. FIG. 6B specifically shows that the lead frame may have the raised portion on which the COICs 328 are mounted. The raised portion may include a first join 612 at a first elevation to receive the COICs 328 and a second joint 616 to receive and support the PLC 320. In some embodiments, the lead frame may correspond to two discrete portions (e.g., a first portion being the first end 304 of the lead frame and a second portion being the second end 308 of the lead frame) that are separated by the bridge 312. Each portion may have a shim face 608 that corresponds to a vertical face defining the bridge 312.

Both the PLC 320 and COICs 328 may be connected with the lead frame via an epoxy 604. The first joint 612 may correspond to a smaller/thinner joint having a lesser amount of epoxy 604 as compared to the second joint 616 that is provided between the lead frame and the PLC 320. In some embodiments, the TMUX 220 may be constructed by cold forming and stamping strips of the lead frame into discrete sections. While the lead frame is still part of a larger plate, the PLC 320 and COICs 328 may be adhered to the two discrete sections of the lead frame and, prior to allowing the epoxy 604 to fully cure, the PLC 320 and COICs 328 may be actively aligned to ensure that the optical components of the COICs 328 with their corresponding optical channels 408. In some embodiments, because the modulator is positioned so close to the amplifier circuitry of the COIC 328, there is no significant losses (e.g., less than 0.4 dB losses) between the amplifier and modulator.

In prior transmitters, there is an electrical channel between the amplifier and modulator that includes a ball grid array (BGA) interface at the amplifier. Prior transmitters also normally included a number of long PCB traces, a solder connection to a flex circuit, flex circuit losses, wire bonds between a flex circuit and an IC chip, and further wire bonds to the modulator. These all contribute to significant channel losses and may cause a channel eye to close just from the impedance discontinuities and the channel losses. On the other hand, embodiments of the present disclosure provide an integrated solution whereby the carrier IC chip (e.g., the COIC 328) includes an amplifier circuit, a bias plane, and a ground plane and each of these components of the carrier IC chip are configured to operate at or above a nominal voltage of zero volts. The EML 412 may then have the modulator amplifier or driver integrated into the silicon of the IC chip and the EML 412 may be mounted on the carrier IC chip (e.g., the COIC 328) thereby minimizing the length of the electrical connection between the amplifier and the EML 412. While a bond wire may be used to facilitate such a connection, the length of the bond wire between the EML 412 and COIC 328 may be relatively short as compared to prior solutions. In some embodiments, a size of the COIC's 328 output loop may be on the order of 0.5 mm whereas prior solutions exhibited an output loop on the order of 20 mm or more.

Figure 7:
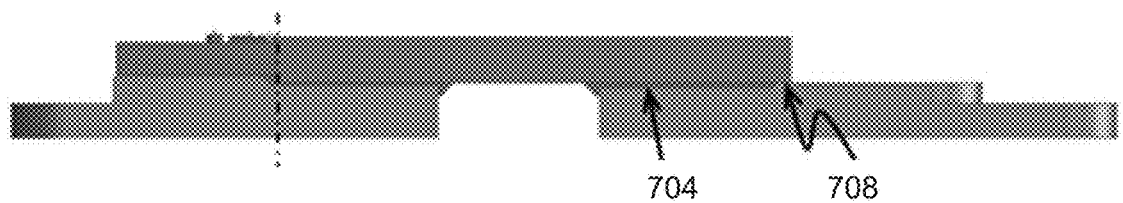
FIG. 7 is another side view of a TMUX in accordance with at least some embodiments of the present disclosure.

As can be seen in FIG. 7, the thick joint section 704 between the PLC 320 and lead frame may be substantially thicker (e.g., at least twice as thick) as the thin joint section 708 between the lead frame and COICs 328. On the side of the lead frame that does not have the COICs 328 mounted thereon, the thin joint section 708 may still be provided such that a portion of the PLC 320 rests atop the further elevated portion of the lead frame in addition to resting atop a lower, but still elevated portion of the lead frame. The additional space between the lead frame and PLC 320 in the thick joint section 704 may be filled with a thicker amount of epoxy 604 as compared to the thin joint section 708. A thick joint could absorb more movement, such as CTE movement, at lower force and stress.

Figure 8:
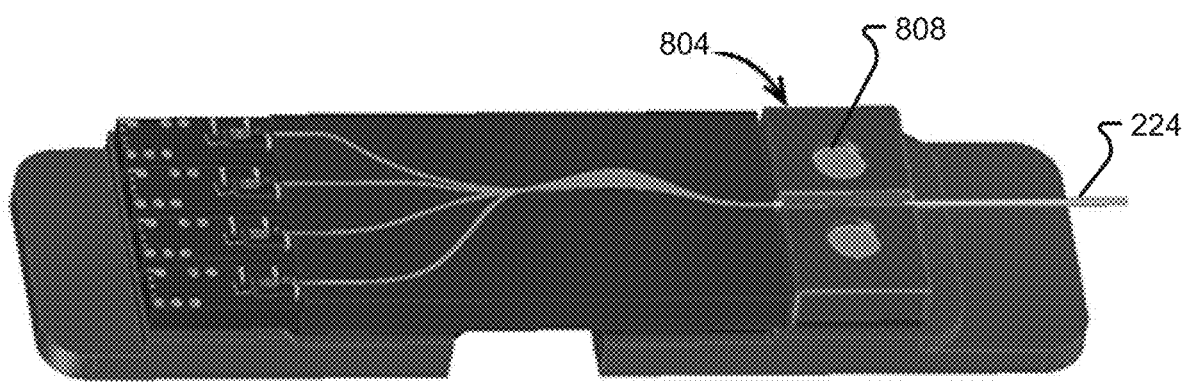
FIG. 8 is an isometric view depicting an interconnection between a fiber optic and a PLC in accordance with at least some embodiments of the present disclosure.
Figure 9:
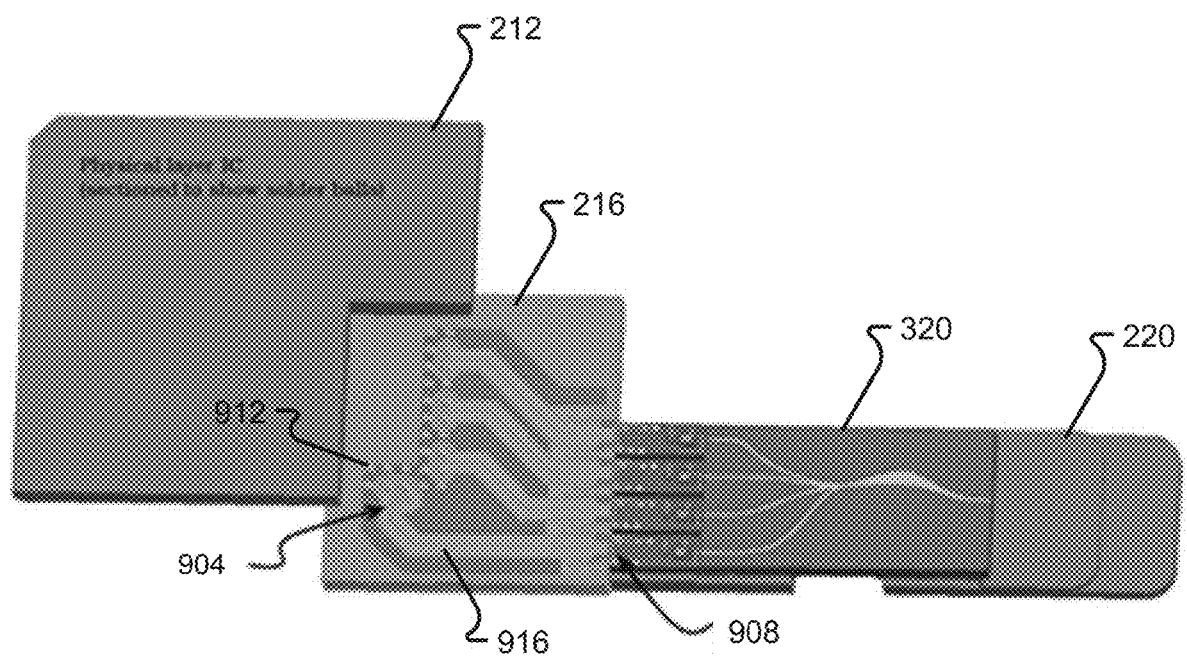
FIG. 9 is an exploded and sectioned view of components of a transceiver PCB in accordance with at least some embodiments of the present disclosure.

FIG. 8 illustrates a possible mechanism that can be used to attach the fiber optic 224 to the TMUX 220. In some embodiments, a fiber holder 804 may be provided on top of the lead frame and adjacent to the PLC 320. The fiber holder 804 may include one or more holes that can be filled to create "plug" joints. A plug joint having the advantage of zero movement as the adhesive cures and shrinks. Although the PLC 320 may be used as part of the mechanical structure for the shim, the PLC reinforcement 324 may provide additional mechanical support the TMUX 220 of the TMUX 220 components are maintained. In some embodiments, the PLC reinforcement 324 may correspond to a chunk of steel, silicon, or the like that is epoxied to the top side of the PLC 320. In some embodiments, the thickness of the PLC reinforcement 324 may be the same as or greater than the thickness of the PLC 320. By using a PLC reinforcement 324 with a similar stiffness to the material used for the PLC 320 (e.g., by using steel for the PLC reinforcement 324 and silicon for the PLC 320) and by having the thicknesses of the two components be substantially equal to one another, the light circuit within the PLC 320 can be maintained at the neutral axis of stress and can reduce the overall stresses in the TMUX 220.

In some embodiments, the PLC reinforcement 324 may be placed atop both the PLC 320 and the fiber holder 804.

In some embodiments, the PLC reinforcement 324 only partially overlaps the studs 808 of the fiber holder 804.

With reference now to FIGS. 9-12, additional details of the mechanisms for enabling electrical communications between components of the transmitter will be described in accordance with at least some embodiments of the present disclosure. In some embodiments, one or more solder balls 912 may be used to electrically connect contacts on the bottom surface of the physical layer IC 212 with contacts 904 on the top surface of a section 216 of the transceiver card 204 PCB. The contacts 904 may carry electrical signals to the COICs 328 via one or more traces 916 and one or more wire bonds 908. In some embodiments, a discrete set of traces 916 may be provided for each COIC 328. Thus, if the TMUX 220 has four COICs 328, then the section 216 may include four discrete sets of traces 916, where each set of traces includes traces for carrying control signals to the COIC 328 and traces for carrying ground signals to the COIC 328 and traces for carrying power, I2C, and/or laser signals to the COIC 328. It should be appreciated that one or multiple solder balls 912 may be provided for each contact 904.

Figure 10A:
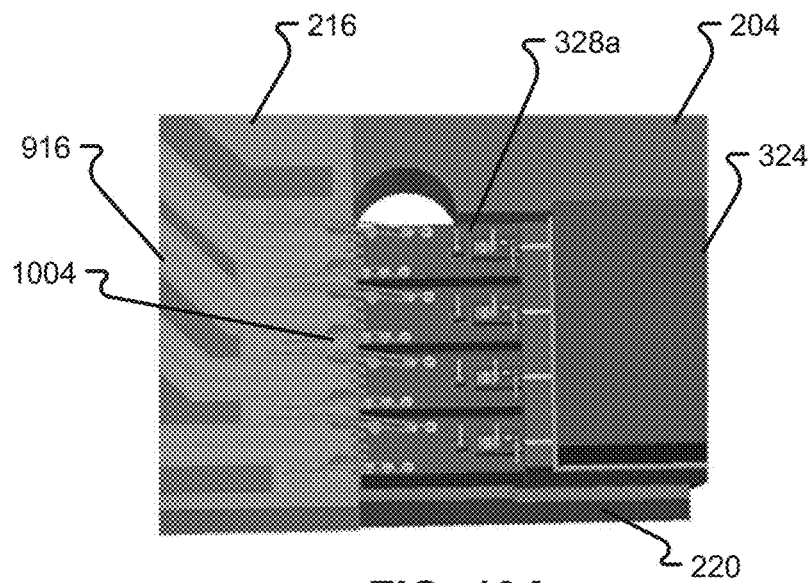
FIG. 10A is a detailed isometric view of interconnections between COICs and an external channel component in accordance with at least some embodiments of the present disclosure.
Figure 10B:
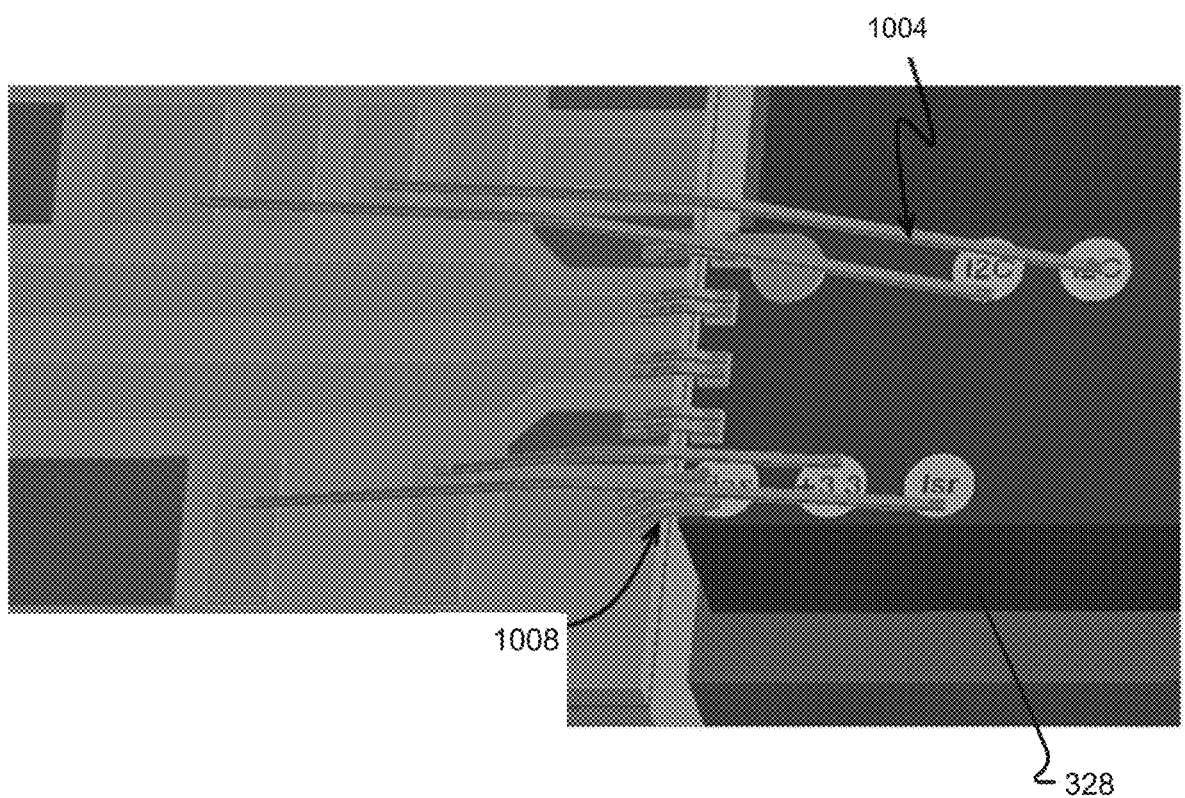
FIG. 10B is a further detailed isometric view showing wirebonds in accordance with at least some embodiments of the present disclosure.

FIGS. 10A and 10B depict additional details of the interface between the COICs 328 and the section 216. In particular, embodiments of the present disclosure contemplate that one or more long wire bonds 1004 may be used to connect certain contacts of the COIC 328 to certain contacts on the section 216. In some embodiments, one or more short wire bonds 1008 may be used to connect other contacts of the COIC 328 to other contacts on the section 216. Short wire bonds 1008 may be used for high-speed signaling whereas the long wire bonds 1004 may be used for low-speed connections. As a non-limiting example, the long wire bonds 1004 may be used to connect the I2C contacts 508, the power supply contact 528, and the laser contact 532, which are provided more toward the center of the COIC 328. On the other hand, the short wire bonds 1008 may be used to connect to the grounds contacts 504, 520, the signal contacts 512, 516, and the bias contact 524 as these signals may contribute more heavily to noise or signal distortion if the length of the wire bond is increased. Other bond wire configurations that reduce the bond wire inductance could also be employed.

Figure 11:
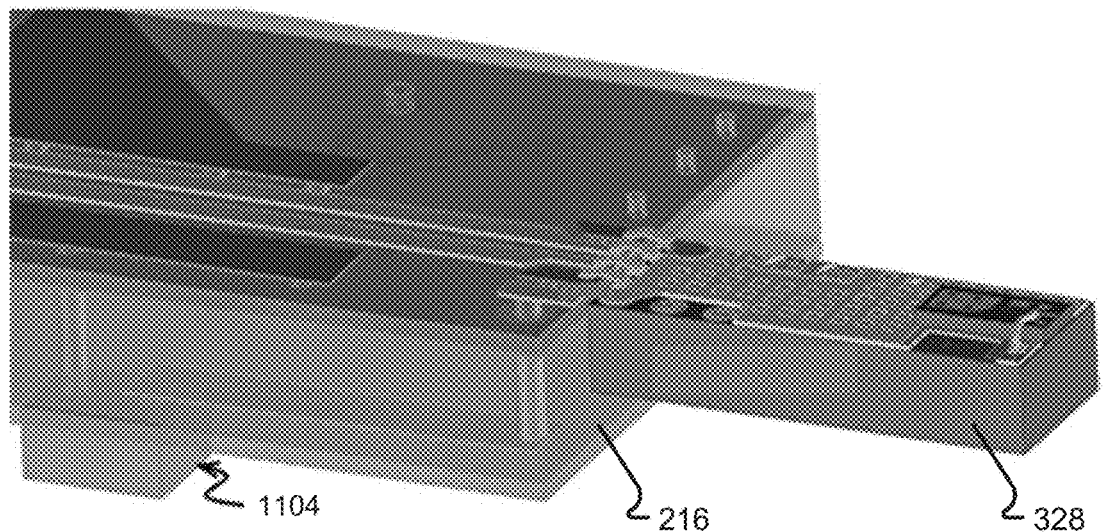
FIG. 11 is an isometric view depicting a COIC and external channel component in accordance with at least some embodiments of the present disclosure.

With reference now to FIG. 11, additional details of the section 216 are depicted in accordance with at least some embodiments of the present disclosure. Again, the COIC 328 is shown as being connected with the section 216 via one or more wire bonds 1004, 1008 at the top surface thereof. The section 216 is further shown to include at least one bias decoupling capacitor 1104 on its bottom surface (e.g., the surface that opposes the surface where wire bonds are provided between the section 216 and the COICs 328). In some embodiments, the bias decoupling capacitor 1104 may be provided to decouple the bias signal provided to the COIC 328 from the section 216.

Figure 12:
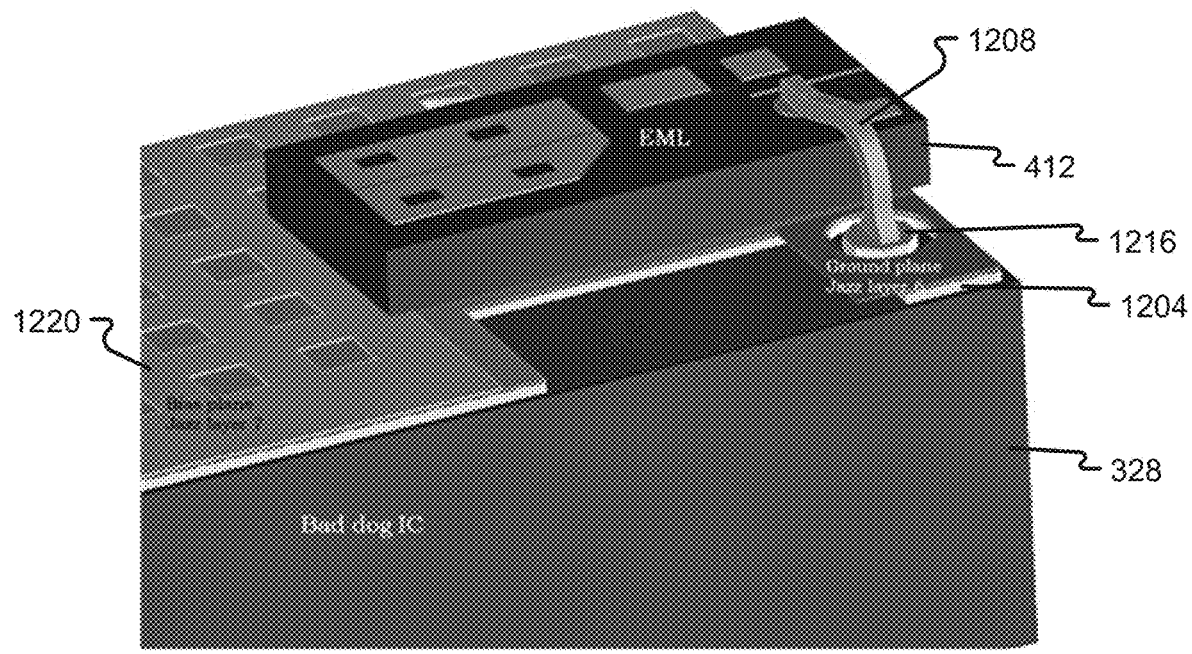
FIG. 12 is an isometric view depicting a COIC supporting to and connected with an EML in accordance with at least some embodiments of the present disclosure.

FIG. 12 illustrates additional details of the COIC 328 and its connections with the EML 412 in accordance with at least some embodiments of the present disclosure. The COIC 328 is shown to include a ground plane 1204 and a bias plane 1220. In some embodiments, the ground plane 1204 is situated below (e.g., underneath) the bias plane 1220 to create some decoupling capacitance that is exceptionally close and compatible with high-speed signaling. The COIC 328 is further shown to include a contact pad 1216 situated near the top of the COIC 328. The contact pad 1216 may provide a pad onto which a short wire bond 1208 can connect with the COIC 328. The other end of the bond wire

1208 may then be attached to the top surface of the EML 412, which is the modulator in this example EML.

Because the EML 412 has a common substrate between the DFB laser and modulator, as will be described in further detail herein, any noise on the substrate could modulate the laser light (and become noise in the optical signal). In conventional solutions, the EML would sit on a trace on ceramic and be isolated from ground by the wire bond to the flex, the solder joint between the flex, and PCB with all the associated inductances, resistances and impedance disruptions. The COIC 328, in comparison, has an integrated decoupling capacitance that is used in conjunction with close decoupling capacitance.

Figure 13:
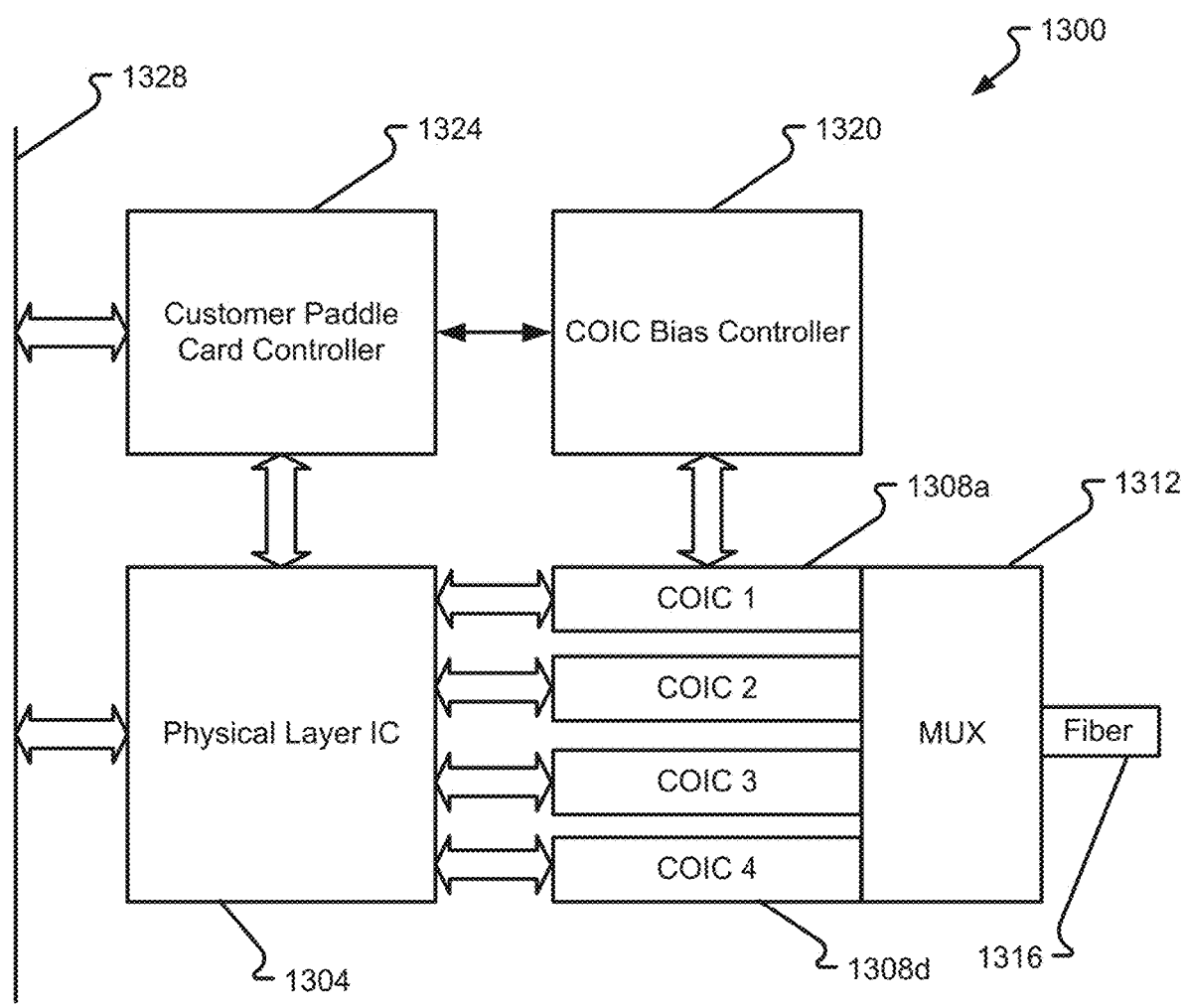
FIG. 13 is a block diagram of transmitter components in accordance with at least some embodiments of the present disclosure.
Figure 14A:
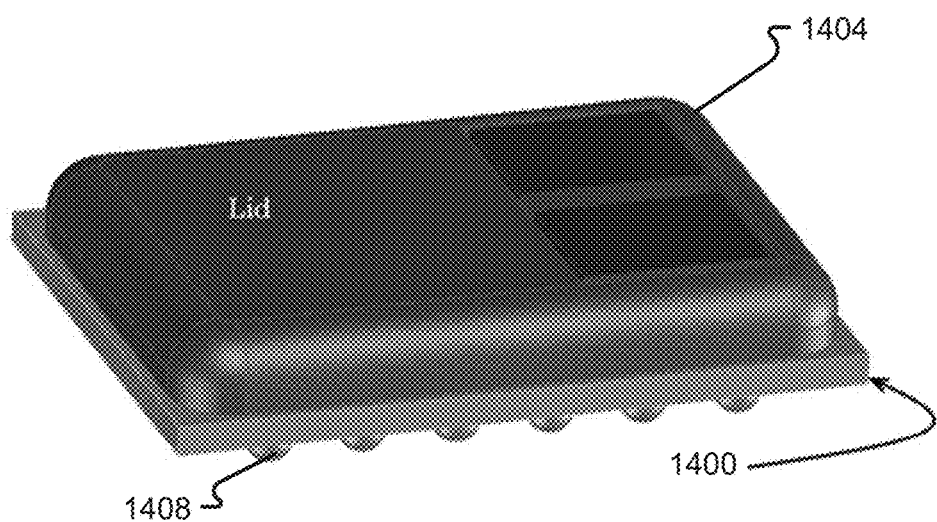
FIG. 14A is a top isometric view of a bias controller in accordance with at least some embodiments of the present disclosure.
Figure 14B:
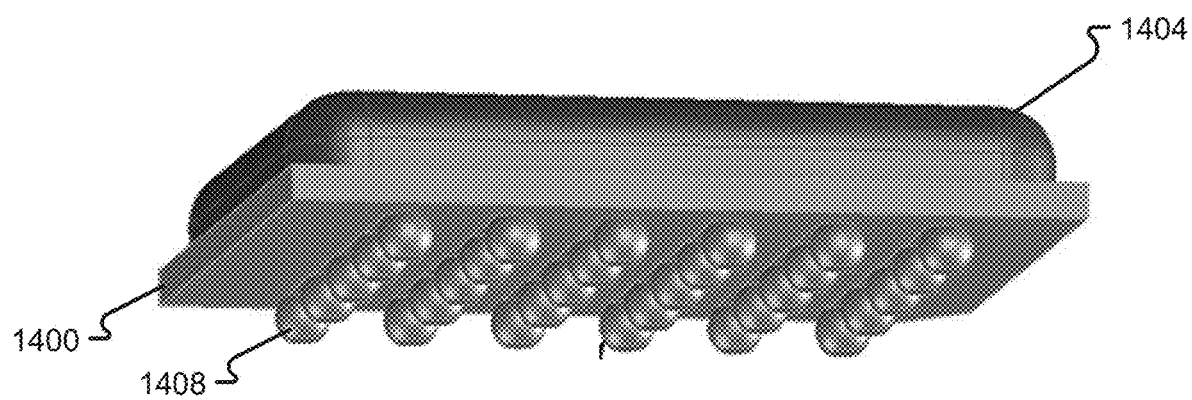
FIG. 14B is a bottom isometric view of a bias controller in accordance with at least some embodiments of the present disclosure.

With reference now to FIG. 13, additional details of components that may be used on a 204 will be described in accordance with at least some embodiments of the present disclosure. The components 1300 may include the card circuitry 1328, the physical layer IC 1304, the plurality of COICs 1308*a-d*, a multiplexer 1312, fiber 1316, the COIC bias controller 1320, and the customer paddle card controller 1324. The card components 1328 may include one or more components depicted and described as being included in the transceiver card 204 itself. The physical layer IC 1304 may correspond to the physical layer IC 212 or electrical components thereof. The COICs 1308*a-d* may correspond to the COICs 328*a-d* or electrical components thereof. The multiplexer 1312 may correspond to the PLC 320 or components thereof, such as the combined optical channel 404. The fiber 1316 may correspond to the fiber optic 224.

The COIC bias controller 1320 may correspond to one or more components that are used to control or set a bias voltage provided to the TMUX 220 and/or components thereof. The COIC bias controller 1320 may be positioned on the transceiver card 204, for example, at a location farthest away from the contacts 208 since this is not in the signal path and contains no high speed signals. In some embodiments, the COIC bias controller 1320 may be provided at an end of the transceiver card 204 that is opposite the contacts 208 rather than being positioned in valuable space next to the contacts 208. In some embodiments, the COIC bias controller 1320 may not need high-speed signals for operation. As a non-limiting example, the COIC bias controller 1320 may correspond to an IC package or system in a package in that a single package contains multiple IC's and passive components. Each COIC 1308*a-d* may require several DC voltages that are not the 3.3 volts provided by the card 1328. While the voltages are DC, signals, like EML bias may not be fixed. Rather, the voltages provided by the COIC bias controller 1320 may vary uniquely with temperature and with the specific COIC 1308*a-d*. The bias DC provided by the COIC bias controller 1320 can be shared across all COIC's 1308*a-d*, but the DFB supply provided by the physical layer IC 1304 may be unique to each COIC 1308*a-d*.

As shown in FIG. 13, the optical signals output by each COIC 1308*a-d* may be combined by the multiplexer 1312 and placed onto the common fiber 1316. The customer paddle card controller 1324 may correspond to an additional controller IC that is placed onto the transceiver card 204 or it may correspond to a controller IC that is separate from the transceiver card 204 and connected with the transceiver card 204 via the contacts 208. As shown in FIG. 13, there may be a communication link between the customer paddle card controller 1324 and the COIC bias controller 1320 to synchronize the control of the physical layer IC 1304 and COICs 1308*a-d*. In some embodiments, the customer paddle card controller 1324 and COIC bias controller 1320 may be integrated into a single controller IC without departing from the scope of the present disclosure.

With reference now to FIGS. 14A, 14B, 15, and 16 additional details of an illustrative COIC bias controller 1320 will be described in accordance with at least some embodiments of the present disclosure. The COIC bias controller 1320 is shown to include a substrate 1400 onto which a lid 1404 is provided on one side and a plurality of solder balls 1408 are provided on the other side. In some embodiments, the lid 1404 may correspond to a plastic molded part that is attachable to the top surface of the substrate 1400 and is used to protect various components that are also mounted to the top surface of the substrate 1400. The solder balls 1408 may be provided as a BGA or the like and may be used to connect the various components of the COIC bias controller 1320 to electrical traces on the transceiver card 204.

Figure 15:
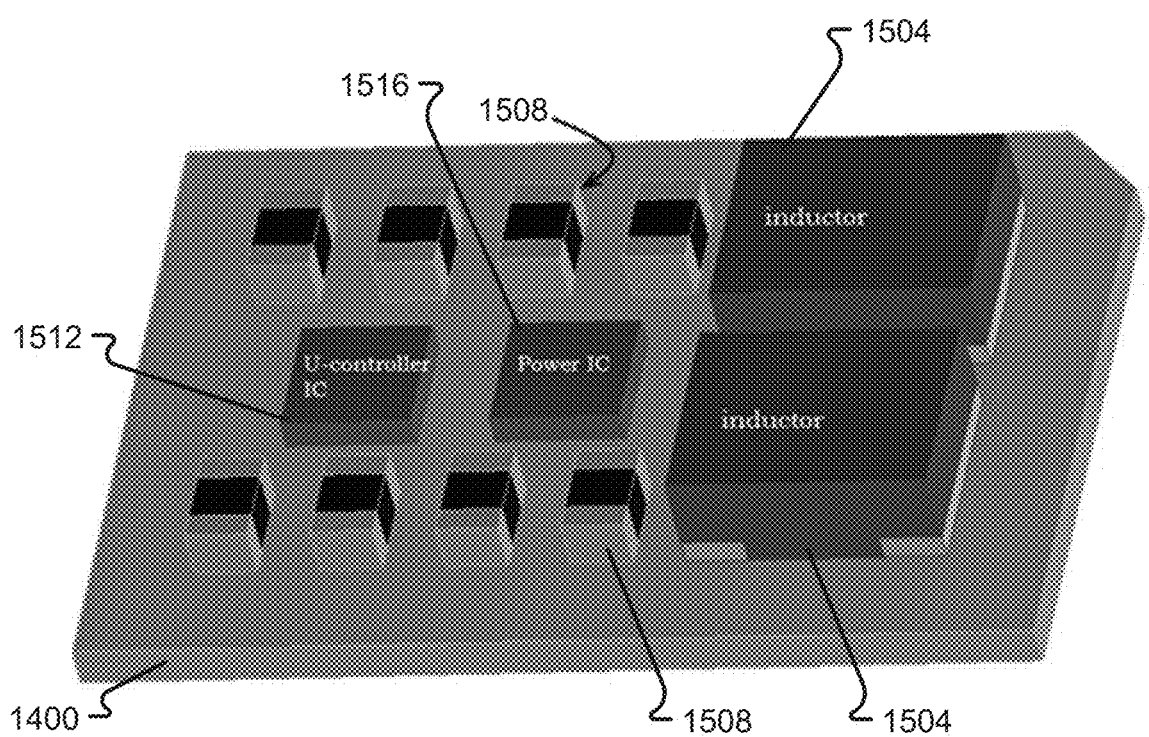
FIG. 15 is an exploded view of a bias controller in accordance with at least some embodiments of the present disclosure.

As shown in FIG. 15, the COIC bias controller 1320 may include one or more inductors 1504, one or more other circuit elements 1508, a controller IC 1512, and a power IC 1516. The substrate 1400 may be configured to physical support each of these components. The substrate 1400 may further have one or more conductive vias that connect these various components to the solder balls 1408 provided on the back side of the substrate 1400. In some embodiments, the additional circuit elements 1508 may include one or more capacitors and one or more fast/power diodes that are configured to dynamically adjust a bias voltage provided to the COICs 1308*a-d*. The amount of bias voltage provided to the COICs 1308*a-d* may vary based on environmental conditions such as temperature and optical feedback readings.

Figure 16:
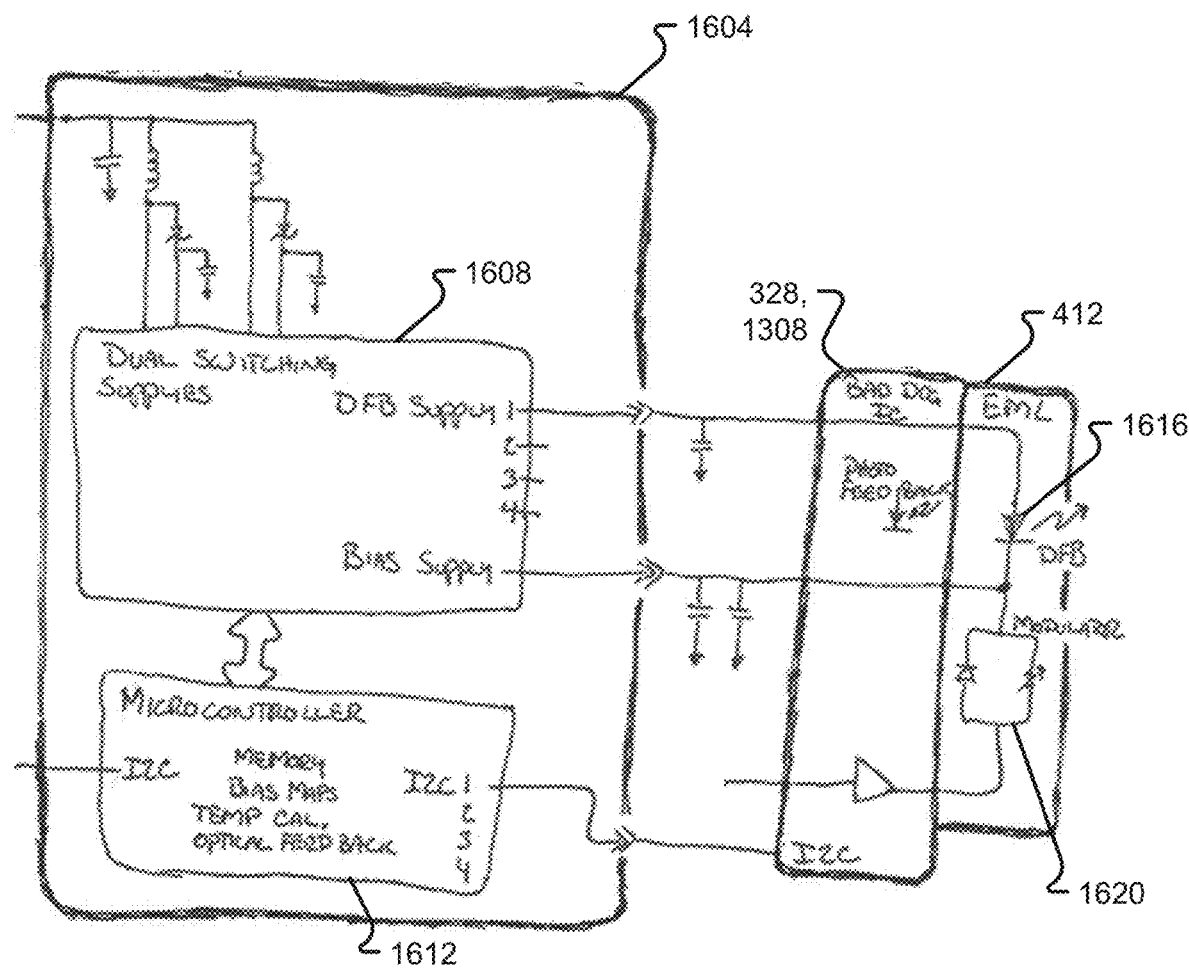
FIG. 16 is a circuit diagram depicting an illustrative bias control circuit in accordance with at least some embodiments of the present disclosure.

As shown in FIG. 16, the COIC bias controller 1320 may be configured with controller components 1604 that include dual switching power supplies 1608 as well as a microcontroller 1612. In some embodiments, the data amplifier may operate around 1.5 volts. The bias voltage (e.g., substrate of the EML 412) might be around 3.5 volts and the light source 1616 could be around 5.5 volts. Bias voltage provided to various components may depend upon temperature, manufacturing offsets, and a chosen operating point and can range from 0.5 to 2.25 volts above the amplifier voltage (e.g., an absolute range 2.0 to 3.75 volts). In some embodiments, the referenced amplifier may correspond to the signal amplifier on each of the COIC's. The center point of these amplifiers is often about 1.5 volts. Thus, the light source 1616 may operate at a voltage, possibly in the range of 2V over the bias voltage, but the absolute number may be unique to the light source 1616 and may be set based on optical feedback (e.g., closed loop light output control) and a desired operating point. The absolute range of a light source 1616 voltage may be anywhere between 3.9 to 5.85 volts with the example EML and assumed COIC amplifier center voltage of approximately 1.5 volts.

In some embodiments, the light source 1616 may correspond to a DFB, such as a low impedance DFB. In such a configuration, the low impedance DFB may be driven by current sources because a current source may have better control over the DFB's output but the closed loop control is likely to work sufficiently well with a voltage-controlled output. Voltage sources are often easier to design, have less power loss than current sources, and are commonly cheaper.

DFBs often require a high current and, in some embodiments, the DFB may operate between 25 and 150 ma. The control of such devices may be somewhat complex because the DFB light output varies with temperature, age, and varies from device to device based on manufacturing variations. In some embodiments, the EML 412 may itself create an offset that looks like a temperature offset to the controller 1604. While there is a possibility of using a photodiode 416 for optical power feedback, the calibration of that offset is unique to each device. In some embodiments, the microcontroller 1612 may be used to store the calibration data which can be accessed via I2C and provided to the COIC 328, 1308.

In some embodiments, the bias/substrate voltage can be chosen by temperature. In a transceiver, all COICs 328, 1308 may be operating as substantially the same temperature, so the bias voltage can be shared common to all COIC's 328, 1308. In some embodiments, the bias line may be a current sink, somewhat different from most switching supplies that are current sources. The DFB's 1616 may be run between 25 to 150 ma, while the modulator 1620 might be run around 12 ma, therefore the bias line will be sinking 52 to 550*ma*.

In accordance with at least some embodiments, the bias line may hold DC while the modulator 1620 is putting high frequency onto the line. The high-speed modulator signal may be handled on the customer paddle card 1324 by placing decoupling capacitors 1104 in close proximity to the COIC's 328 in addition to the decoupling provided by the COIC.

Figure 17:
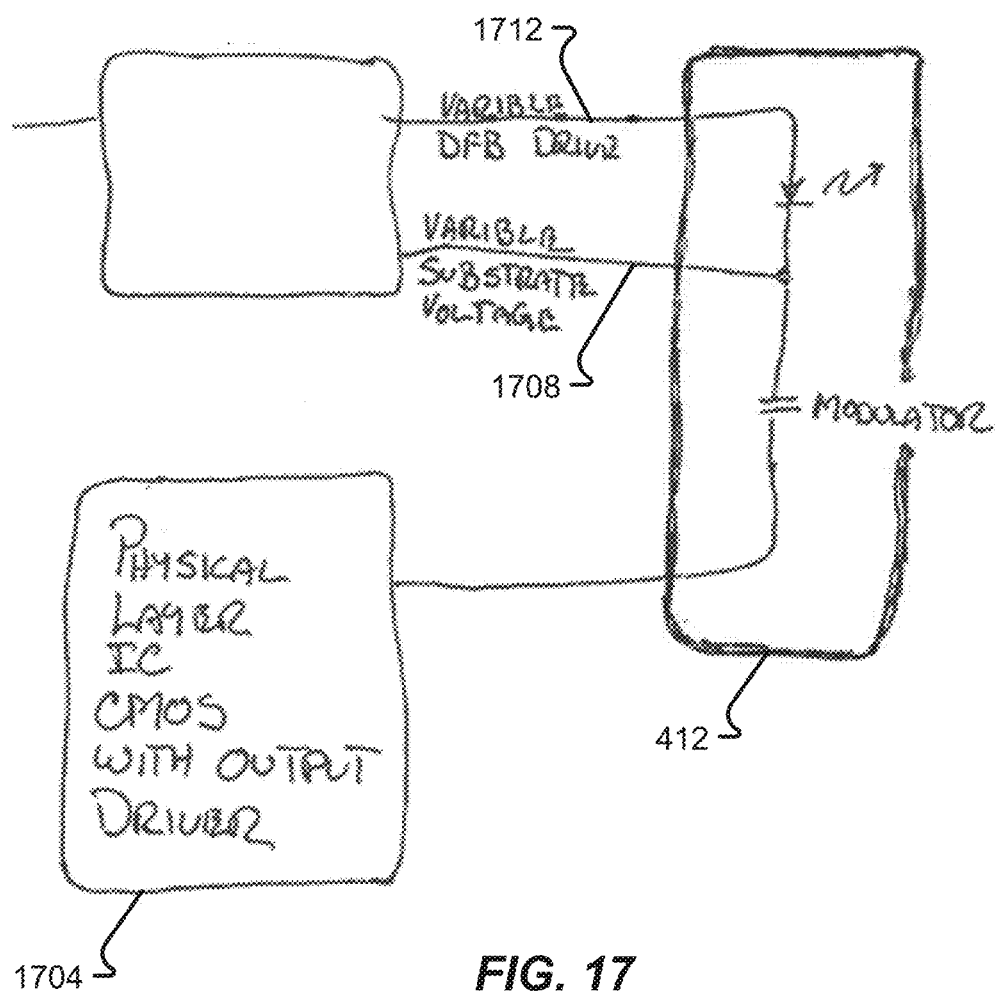
FIG. 17 is a circuit diagram depicting additional details of a single-channel transmitter circuit in accordance with at least some embodiments of the present disclosure.

In some embodiments, the COIC bias controller 1320 may also enable other technology, such as allowing an EML 412 to be DC coupled to CMOS. As shown in FIG. 17, the EML circuit 412 may be controlled by the COIC bias controller 1320 with a variable substrate voltage signal 1708 as well as a variable DFB drive signal 1712. In the depicted embodiment, the physical layer IC 1704 may include CMOS without an output driver. This particular configuration may enable the EML 412 to be driven directly from CMOS, such as a 7 nm CMOS, which can be used for the physical layer IC 1704. In some embodiments, the operating point of CMOS may be less than one volt (instead of a COIC operating at approximately 1.5V).

In some embodiments, the 7 nm CMOS has very limited voltage and current limits which make driving the EML 412 more challenging. Embodiments of the present disclosure, however, enable all the voltage range of the CMOS to be used for the EML's 412 modulator. It should be appreciated that while the COIC bias controller 1320 is shown as being used for a 4-color high-speed data transmission application, it may also be possible to implement the COIC bias controller 1320 in a single channel system, in which case the ability to drive the EML 412 directly from CMOS might be more desirable or easier to accommodate.

Figure 18:
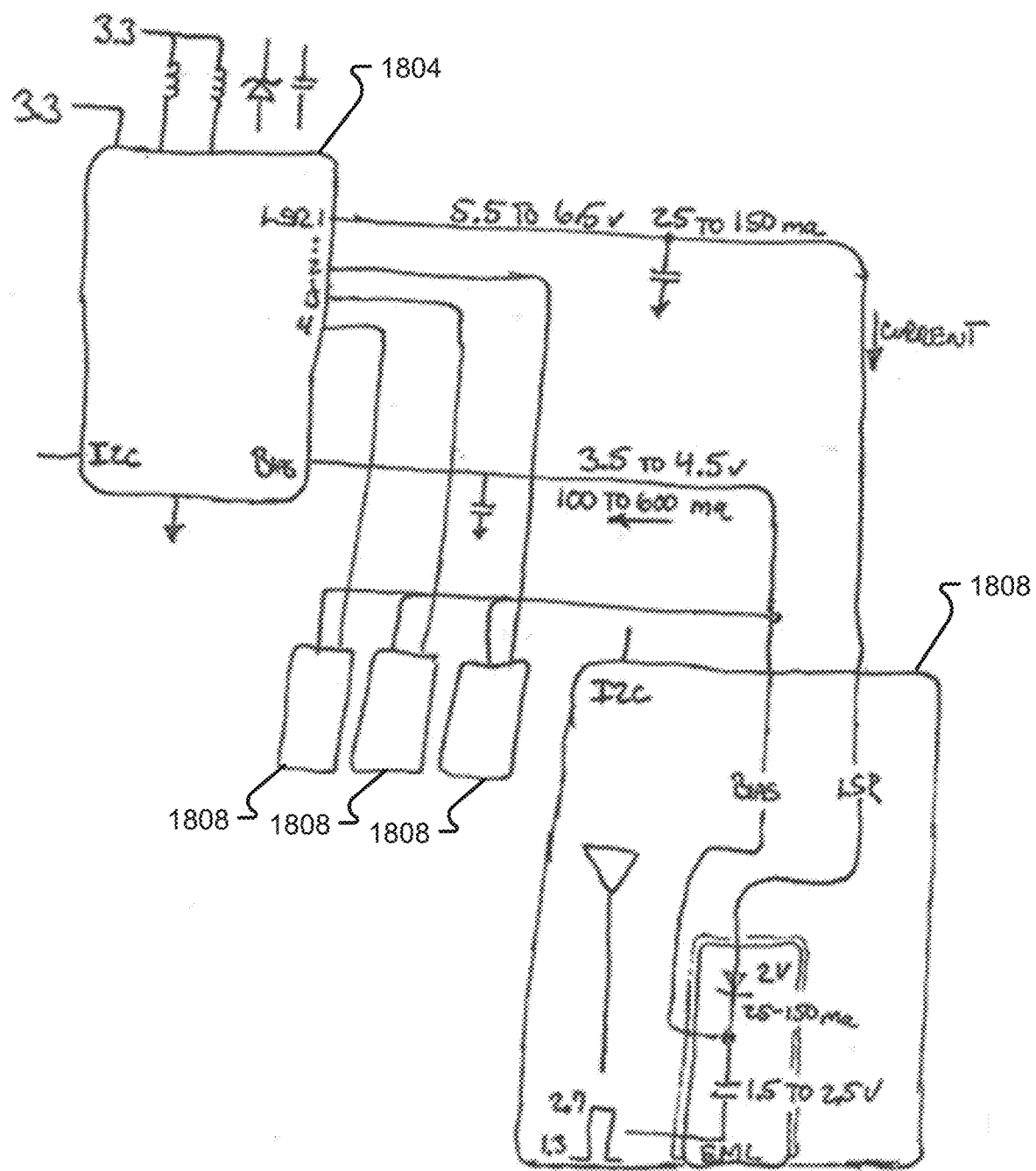
FIG. 18 is a circuit diagram depicting an illustrative support circuit in accordance with at least some embodiments of the present disclosure.

With reference now to FIG. 18, additional details of a power supply support for the COICs 328, 1308 will be described in accordance with at least some embodiments of the present disclosure. FIG. 18 illustrates a control chip 1804, which may correspond to part of the COIC bias controller 1320. In some embodiments, the control chip 1804 is used to bias each COIC 1808 to allow the signal amplifier to swing between 1.3V and 2.7V, a swing of 1.4V. In some embodiments, each COIC 1808, which may be similar or identical to the COICs 328, 1308, receives a common bias signal from the control chip 1804. Each COIC 1808, however, receives an individual control signal for its light source. In some embodiments, the light source may correspond to a laser that is either voltage driven or current driven. In the depicted embodiment, each COIC 1808 includes a closed loop based on photo feedback. Communications for closed loop may be provided by I2C or some other interface.

Figure 19:
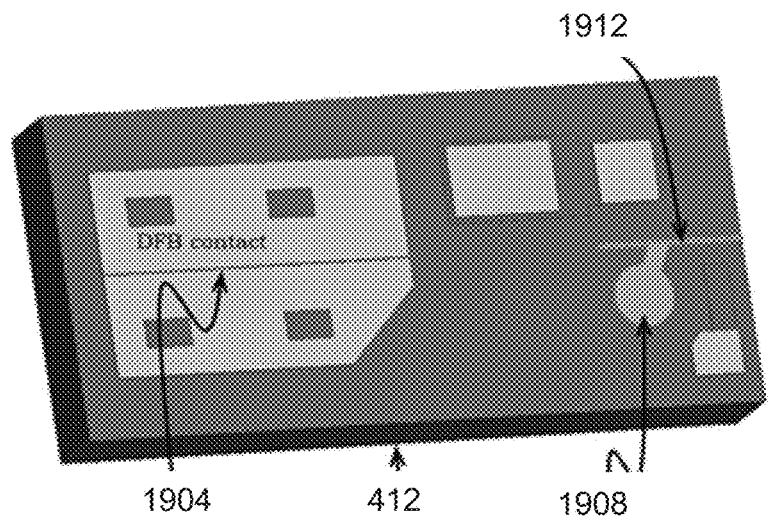
FIG. 19 is an isometric view of an EML in accordance with at least some embodiments of the present disclosure.
Figure 20:
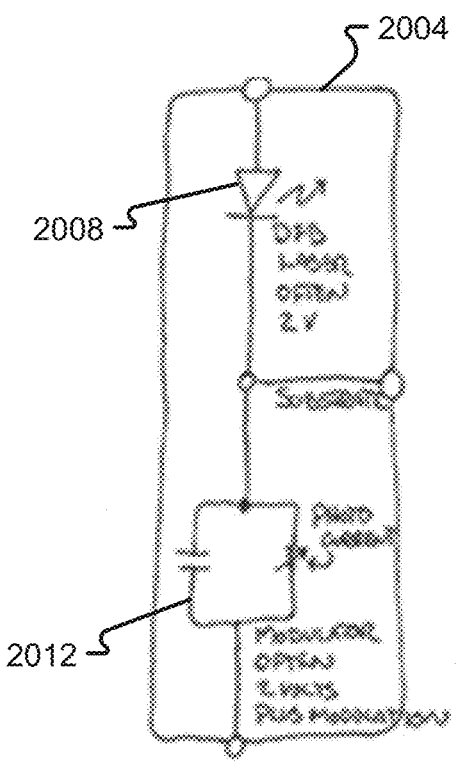
FIG. 20 is a circuit diagram of an illustrative EML electrical circuit in accordance with at least some embodiments of the present disclosure.
Figure 21:
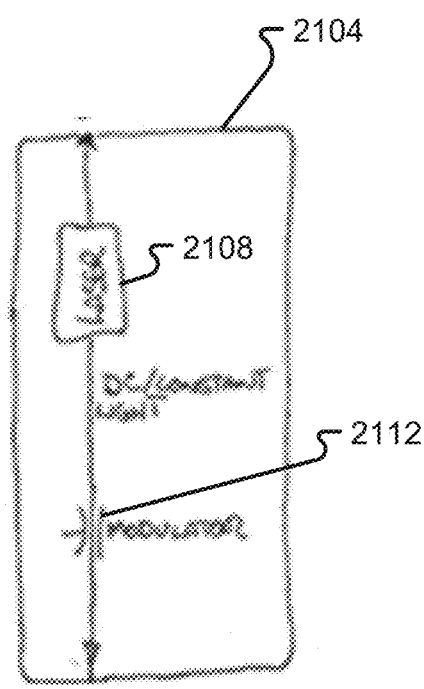
FIG. 21 is a circuit diagram of an illustrative EML optical circuit in accordance with at least some embodiments of the present disclosure.

With reference now to FIGS. 19-21, additional details of the EML 412 will be described in accordance with at least some embodiments of the present disclosure. FIG. 19 illustrates the physical components of an EML 412 according to some embodiments. FIG. 20 illustrates the physical components electrically whereas FIG. 21 illustrates the physical components optically according to some embodiments. The EML 412, as discussed above, may include an integrated laser section 1904 and modulator section 1912, both of which are provided in a common substrate such as GaAs. In some embodiments, the laser section 1904 may have a contact area shown as gold around 1904. The bottom of the EML 412 is common to both the laser and modulator as shown in FIG. 20. As discussed above, the modulator contact 1908 may be connected with a COIC 328 via a wire bond 1208, that is relatively short since the EML 412 can be mounted directly to the top of the COIC 328. The laser section 1904 may also be connected with the COIC 328 via another wire bond, which may be connected to a different plane of the COIC 328 than the wire bond 1208. In some embodiments, the EML 412 may be configured to sit on a metal layer of the COIC 328 and can be connected to any desired voltage thereby creating bias. The COIC 328 may provide the appropriate electrical isolation for the EML 412, while also providing appropriate thermal conduction.

The EML electrical circuit 2004 shows that the light source 2008 and modulator 2012 are electrically connected to a common substrate. It would be common for the modulator to be operated at −2V bias. That is that the DC value at 1908 may be 2V less than the substrate. The light source 2008 may be provided as a DFB that operates around 2V.

As shown in FIG. 21, the EML optical circuit 2104 may include the light source, such as a laser 2108, and the modulator 2112 connected in series therewith. The light source 2108 is commonly direct coupled with the modulator 2112, in some embodiments.

Figure 22:
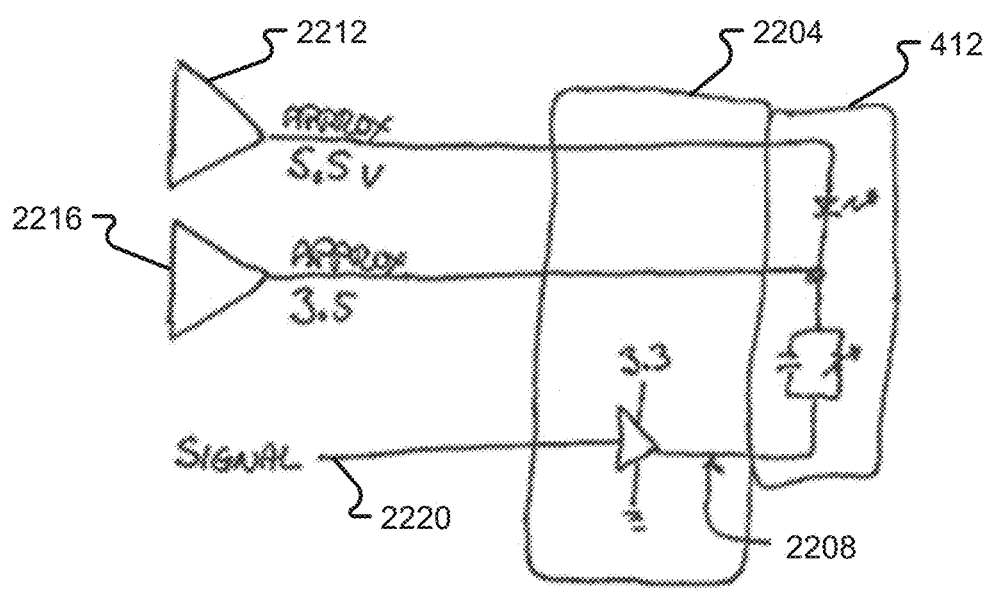
FIG. 22 is a circuit diagram depicting an illustrative programmable power supply circuit in accordance with at least some embodiments of the present disclosure.

As can be seen in FIG. 22, the EML 412 may be configured to operate solely with positive voltages. In accordance with at least some embodiments, COIC components 2204 may provide an architecture in which the amplifier's range is only that used by AC modulation 2208 and the bias point of the modulation is not necessarily of consequence to the EML 412. Thus, all voltages provided by supplies 2212, 2216, and the signal 222 may be positive. This enables conventional logic and devices to be used with the COIC components 2204, thereby reducing the complexity and costs associated with the overall system implementation.

Figure 23:
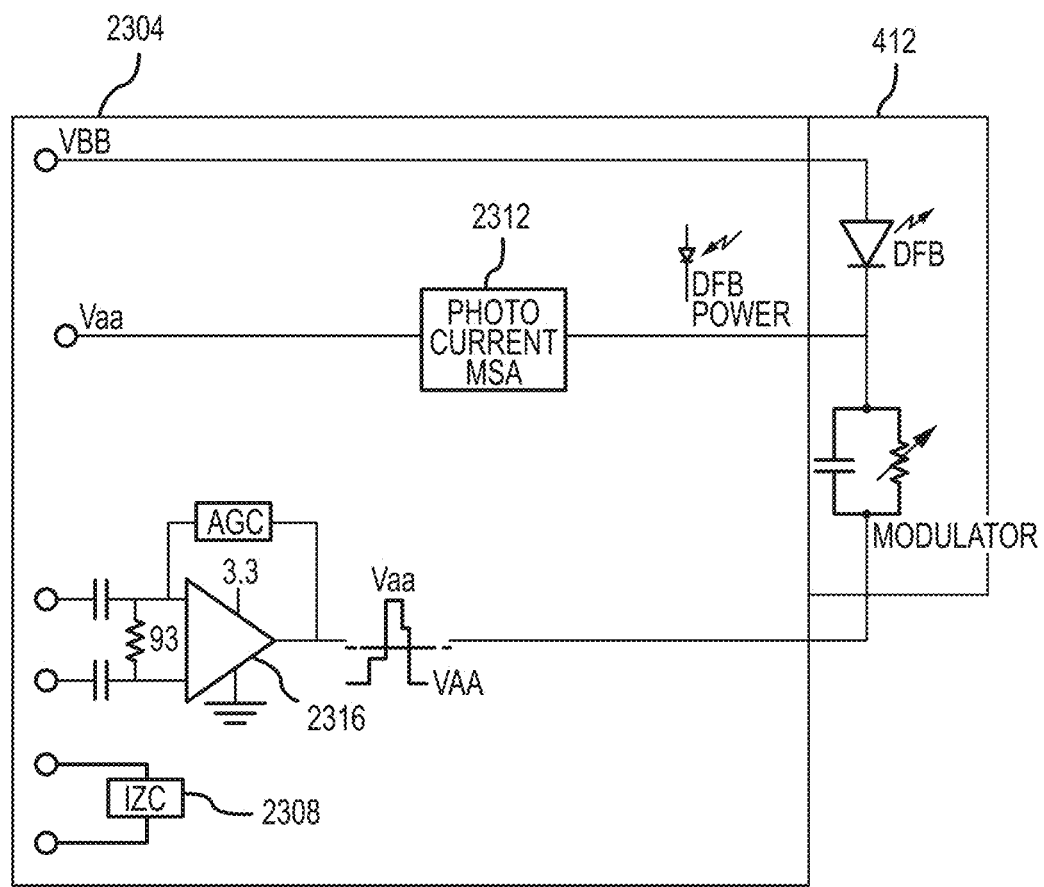
FIG. 23 is a circuit diagram depicting an illustrative measurement circuit in accordance with at least some embodiments of the present disclosure.

Because the COIC components may be built on a silicon IC, instead of a ceramic, other functions become available to the COIC 328. For instance, as depicted in FIG. 23, a measurement circuit 2304 may be provided as part of the COIC 328 or may be provided in connection with the COIC 328 without departing from the scope of the present disclosure. In some embodiments, the measurement circuit 2304 may include I2C components 2308, one or more current sensors 2312, and a sensor driver 2316. In some embodiments, the measurement circuit 2304 and the current sensor 2312 may be used to provide one or more functions such as gain control, memory, A/D's and D/As, circuitry to measure temperature, circuitry to measure currents, circuitry to measure voltages, and digital interface to communicate between the EML 412 and the physical layer IC 212.

In some embodiments, the circuitry 2304 may include a one-time programmable (OTP) memory that provides a temperature calibration function. According to some embodiments, IC temperature measurements vary, and may need to be calibrated, usually at two temperatures, to calculate calibration constants offset and gain. A possible manufacturing variation in an EML 412 has to do with the alignment of the DFB and modulator and the error, which may appear as a temperature offset. When manufacturing the COIC 328 and EML 412, it may be possible to calibrate the temperature, which can be combined with the EML offset, and then stored in the OTP memory.

There may also be the ability for the circuit components 2304 to provide optical power monitoring functions for the DFB. In some embodiments, the optical power monitor may be calibrated, because of the photo diode and manufacturing tolerance, like placement. The calibration for optical power monitoring can also be saved in OTP memory.

According to some embodiments, the COIC 328 and EML 412 may be tested as an amplifier/EML together, including high speed testing and under multiple test conditions, such as different optical outputs, temperatures, customer specific tests or changing specifications, wafer tests, reliability results or product characterization. With each COIC 328 possibly having a serial number, a database can be made available to share this data by storing the data within the OTP memory.

Using a silicon IC allows the COIC 328 to include many other functions available in IC's. A/D's can be used to digitize photo current, temperature, and facet power. D/A's are useful for implementation of AGC (automatic gain control). I2C is available for a standard 2-wire digital communication. None of these are available in the standard ceramic carriers. According to some embodiments, the COIC 328 may also provide room for probing and the number of contacts that can be probed. I2C only requires two pads, but enables many functions and future growth to be implemented without each needing pads.

Figure 24:
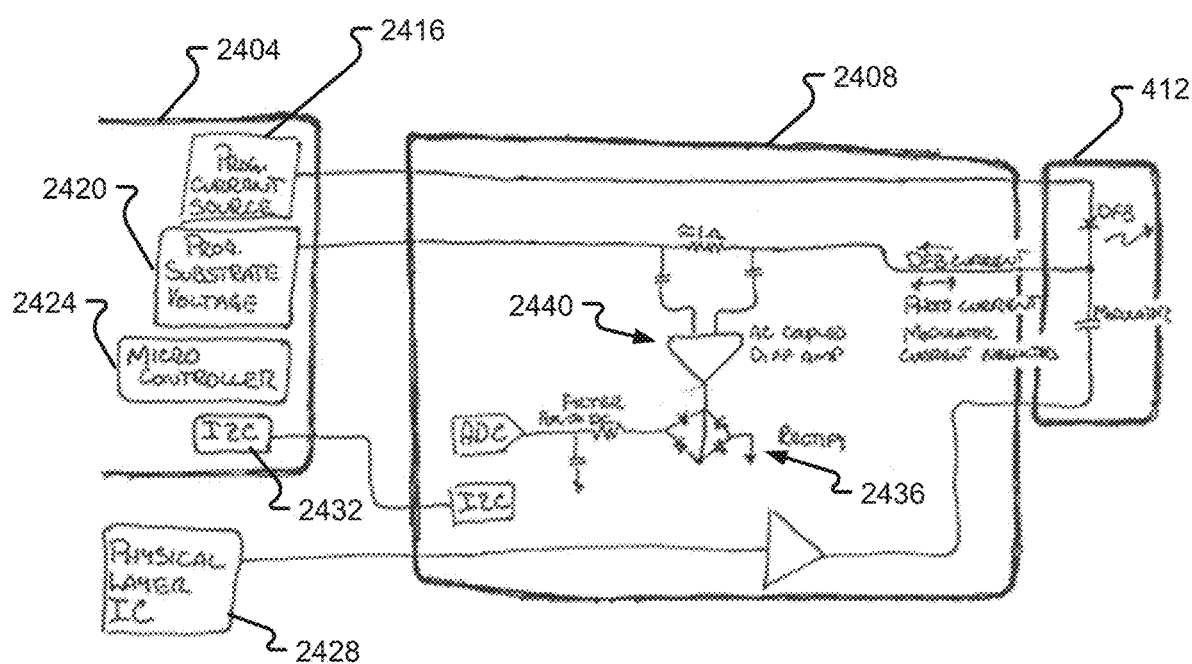
FIG. 24 is a circuit diagram depicting an illustrative photocurrent measurement circuit in accordance with at least some embodiments of the present disclosure.

There may also be mechanisms available to the COIC 328 to measure front facet optical power output by the EML 412. FIG. 24 illustrates one possible technique to isolate and measure the current in the EML 412 in accordance with at least some embodiments of the present disclosure. In some embodiments, the COIC 328 may be provided with a photo current measurement circuit 2408 that couples controller components 2404 to the EML 412. The controller components 2404 may include a programmable current source 2416 that is provided directly to the DFB of the EML 412, a programmable substrate voltage 2420, a microcontroller 2424, and I2C components 2432. The physical layer IC 2428, which may be similar or identical to the physical layer IC 212, may be connected to the modulator of the EML 412 via an amplifier or the like.

In some embodiments, the photo current measurement circuit 2408 includes a differential amplifier 2440 and a rectifier 2436. There may be interest in knowing what power is coming out of the front facet of the EML 412. Commonly the reason is to meet minimum transceiver specifications at the minimum DFB power. In accordance with at least some embodiments, the photo current measurement circuit 2408, which may be integrally formed as part of the COIC 328, can measure the power in the substrate, which is the summation of the DFB current, modulator current and the photo current. With calibration, this can be used to isolate the photo current, which describes how much loss there is in the modulator and can be used to calculate front facet optical power.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A system, comprising:
a carrier Integrated Circuit (IC) chip comprising an amplifier circuit, a bias plane, and a ground plane, wherein the amplifier circuit, bias plane, and the ground plane each operate at or above a nominal voltage of zero volts; and
a laser diode integrated with an electro-absorption modulator into a single IC chip, wherein the laser diode is mounted on the carrier IC chip and is electrically connected with the amplifier circuit of the carrier IC chip through a bond wire.

2. The system of claim 1, wherein a single bond wire is used to electrically connect the amplifier circuit of the carrier IC chip with the laser diode.

3. The system of claim 1, wherein the carrier IC chip comprises a first surface and opposing second surface, wherein the single IC chip comprises a first surface and opposing second surface, and wherein the first surface of the single IC chip is placed into contact with the second surface of the carrier IC chip.

4. The system of claim 1, further comprising:
a physical layer IC chip; and
a card that supports the physical layer IC chip and the carrier IC chip on a common surface thereof.

5. The system of claim 4, wherein the laser diode is driven by the physical layer IC chip, the system further comprising:
a transmission multiplexer that receives light emitted by the laser diode and multiplexes the light emitted by the laser diode with light emitted by other laser diodes which are also driven by the physical layer IC chip for transmission on a single optical fiber.

6. The system of claim 5, further comprising:
a second carrier IC chip comprising an amplifier circuit, a bias plane, and a ground plane, wherein the amplifier circuit, bias plane, and the ground plane of the second carrier IC chip each operate at or above a nominal voltage of zero volts; and
a second laser diode integrated with an electro-absorption modulator into a second single IC chip, wherein the second laser diode is mounted on the second carrier IC chip and is electrically connected with the amplifier circuit of the second carrier IC chip through a bond wire.

7. The system of claim 6, further comprising a shim that supports both the carrier IC chip and the second carrier IC chip and that is mounted to the card.

8. The system of claim 7, wherein the laser diode and second laser diode emit light of different wavelengths and wherein the transmission multiplexer further comprises a planar light circuit that combines the light emitted by the laser diode with the light emitted by the second laser diode into a single optical signal that is capable of being coupled onto the single optical fiber.

9. The system of claim 6, further comprising a bias controller that adjusts bias voltages provided to the carrier IC chip and the second carrier IC chip based on a temperature of the carrier IC chip and/or the second carrier IC chip.

10. The system of claim 9, wherein the bias controller further provides an operational voltage to the laser diode of the single IC chip and wherein the operational voltage provided to the laser diode of the single IC chip is different from the bias voltage provided to the carrier IC chip.

11. The system of claim 10, wherein the operational voltage provided to the laser diode of the single IC chip is at least one volt larger than the bias voltage provided to the carrier IC chip.

12. An optical communication device, comprising:
a physical layer Integrated Circuit (IC) chip;
a plurality of optical channels, each of the plurality of optical channels carrying an optical signal that is produced by the physical layer IC chip and each of the plurality of optical channels being optically aligned with a Chip on IC (COIC) comprising:
   a silicon carrier IC chip operating with a positive bias voltage; and
   a laser diode integrated with a modulator into a single IC chip, wherein the laser diode is mounted on the silicon carrier IC chip and is electrically connected with the silicon carrier IC chip through a bond wire.

13. The optical communication device of claim 12, wherein a single bond wire is used to electrically connect the silicon carrier IC chip with the laser diode.

14. The optical communication device of claim 12, further comprising a planar light circuit that combines light from the plurality of optical channels into a single optical signal.

15. The optical communication device of claim 14, wherein the planar light circuit comprises an array waveguide grating implemented in silicon.

16. The optical communication device of claim 14, further comprising a shim that supports the planar light circuit and that physically connects with a board that carries the physical layer IC chip.

17. The optical communication device of claim 12, wherein the silicon carrier IC chip further comprises a photo diode mounted thereon that monitors a back facet power of the laser diode.

18. The optical communication device of claim 12, further comprising an optical fiber that carries optical signals emitted on the plurality of optical channels.

19. The optical communication device of claim 12, further comprising a bias controller that provides the bias voltage to the silicon carrier IC chip and that also provides an operational voltage to the laser diode, wherein the operational voltage provided to the laser diode is different from the bias voltage and wherein the bias voltage is dynamically adjusted by the bias controller based on temperature.

20. A method of operating an optical communication system, comprising:
providing a plurality of optical channels;
operating a silicon carrier IC chip with a positive bias voltage;
electrically connecting, through a bond wire, the silicon carrier IC chip with a laser diode that is integrated with a modulator into a single IC chip; and
causing one or more optical signals to be transmitted on a plurality of optical channels by driving the modulator with the silicon carrier IC chip.

* * * * *